(12) United States Patent
Nishijima et al.

(10) Patent No.: US 9,478,704 B2
(45) Date of Patent: Oct. 25, 2016

(54) SEMICONDUCTOR DISPLAY DEVICE

(71) Applicant: Semiconductor Energy Laboratory Co., Ltd., Atsugi-shi, Kanagawa-ken (JP)

(72) Inventors: Tatsuji Nishijima, Kanagawa (JP); Seiichi Yoneda, Kanagawa (JP); Takuro Ohmaru, Kanagawa (JP); Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/686,366

(22) Filed: Nov. 27, 2012

(65) Prior Publication Data

US 2013/0134416 A1    May 30, 2013

(30) Foreign Application Priority Data

Nov. 30, 2011   (JP) .................................. 2011-261970

(51) Int. Cl.
| | |
|---|---|
| H01L 29/10 | (2006.01) |
| H01L 33/16 | (2010.01) |
| G09G 3/36 | (2006.01) |
| H01L 27/12 | (2006.01) |
| G02F 1/1362 | (2006.01) |

(52) U.S. Cl.
CPC ............. *H01L 33/16* (2013.01); *G09G 3/3648* (2013.01); *G02F 2001/136295* (2013.01); *G09G 2330/022* (2013.01); *H01L 27/1225* (2013.01)

(58) Field of Classification Search
CPC ........................... H01L 27/1225; H01L 33/16

USPC ........................................................... 257/43
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |

(Continued)

FOREIGN PATENT DOCUMENTS

| | | |
|---|---|---|
| CN | 102741915 A | 10/2012 |
| DE | 69123770 D1 | 6/1997 |

(Continued)

OTHER PUBLICATIONS

International Search Report (Application No. PCT/JP2012/080528) dated Feb. 26, 2013, in English.

(Continued)

*Primary Examiner* — Ajay K Arora
(74) *Attorney, Agent, or Firm* — Fish & Richardson P.C.

(57) ABSTRACT

In the case where a still image is displayed on a pixel portion having a pixel, for example, a driver circuit for controlling writing of an image signal having image data to the pixel portion stops by stopping supply of power supply voltage to the driver circuit, and writing of an image signal to the pixel portion is stopped. After the driver circuit stops, supply of power supply voltage to a panel controller for controlling the operation of the driver circuit and an image memory for storing the image data is stopped, and supply of power supply voltage to a CPU for collectively controlling the operation of the panel controller, the image memory, and a power supply controller for controlling supply of power supply voltage to a variety of circuits in a semiconductor display device is stopped.

12 Claims, 16 Drawing Sheets

(56) References Cited

U.S. PATENT DOCUMENTS

| | | | |
|---|---|---|---|
| 6,127,702 A | 10/2000 | Yamazaki et al. |
| 6,294,274 B1 | 9/2001 | Kawazoe et al. |
| 6,314,017 B1 | 11/2001 | Emori et al. |
| 6,535,985 B1 | 3/2003 | Oshima et al. |
| 6,563,174 B2 | 5/2003 | Kawasaki et al. |
| 6,727,522 B1 | 4/2004 | Kawasaki et al. |
| 6,782,483 B2 | 8/2004 | Oshima et al. |
| 6,792,552 B2 | 9/2004 | Oshima et al. |
| 6,795,929 B2 | 9/2004 | Oshima et al. |
| 6,804,791 B2 | 10/2004 | Oshima et al. |
| 6,839,855 B2 | 1/2005 | Oshima et al. |
| 6,882,389 B2 | 4/2005 | Oshima et al. |
| 6,909,483 B2 | 6/2005 | Oshima et al. |
| 6,941,481 B2 | 9/2005 | Oshima et al. |
| 6,952,248 B2 | 10/2005 | Oshima et al. |
| 6,952,787 B2 | 10/2005 | Oshima et al. |
| 6,971,037 B2 | 11/2005 | Oshima et al. |
| 6,990,595 B2 | 1/2006 | Oshima et al. |
| 7,006,181 B2 | 2/2006 | Oshima et al. |
| 7,024,572 B2 | 4/2006 | Oshima et al. |
| 7,049,190 B2 | 5/2006 | Takeda et al. |
| 7,061,014 B2 | 6/2006 | Hosono et al. |
| 7,062,667 B2 | 6/2006 | Oshima et al. |
| 7,064,346 B2 | 6/2006 | Kawasaki et al. |
| 7,073,084 B2 | 7/2006 | Oshima et al. |
| 7,079,108 B2 | 7/2006 | Oshima et al. |
| 7,080,272 B2 | 7/2006 | Oshima et al. |
| 7,105,868 B2 | 9/2006 | Nause et al. |
| 7,120,809 B2 | 10/2006 | Oshima et al. |
| 7,211,825 B2 | 5/2007 | Shih et al. |
| 7,213,162 B2 | 5/2007 | Oshima et al. |
| 7,282,782 B2 | 10/2007 | Hoffman et al. |
| 7,286,108 B2 | 10/2007 | Tsuda et al. |
| 7,297,977 B2 | 11/2007 | Hoffman et al. |
| 7,321,353 B2 | 1/2008 | Tsuda et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,432,921 B2 | 10/2008 | Oshima et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,464,281 B2 | 12/2008 | Oshima et al. |
| 7,468,304 B2 | 12/2008 | Kaji et al. |
| 7,501,293 B2 | 3/2009 | Ito et al. |
| 7,548,235 B2 | 6/2009 | Oshima et al. |
| 7,674,650 B2 | 3/2010 | Akimoto et al. |
| 7,732,819 B2 | 6/2010 | Akimoto et al. |
| 7,821,489 B2 | 10/2010 | Oshima et al. |
| 7,924,276 B2 | 4/2011 | Tsuda et al. |
| 8,410,838 B2 | 4/2013 | Kato et al. |
| 8,599,177 B2 | 12/2013 | Koyama et al. |
| 8,922,537 B2 | 12/2014 | Koyama et al. |
| 9,251,748 B2 | 2/2016 | Koyama et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2002/0180724 A1 | 12/2002 | Oshima et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0222955 A1* | 11/2004 | Koyama ............... 345/87 |
| 2005/0017302 A1 | 1/2005 | Hoffman |
| 2005/0128176 A1 | 6/2005 | Oshima et al. |
| 2005/0128177 A1 | 6/2005 | Oshima et al. |
| 2005/0168400 A1 | 8/2005 | Oshima et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0061560 A1 | 3/2007 | Oshima et al. |
| 2007/0061604 A1 | 3/2007 | Oshima et al. |
| 2007/0090365 A1 | 4/2007 | Hayashi et al. |
| 2007/0108446 A1 | 5/2007 | Akimoto |
| 2007/0136566 A1 | 6/2007 | Oshima et al. |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0055218 A1 | 3/2008 | Tsuda et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2011/0089419 A1* | 4/2011 | Yamazaki et al. ............... 257/43 |
| 2011/0090183 A1 | 4/2011 | Yamazaki et al. |
| 2011/0101351 A1 | 5/2011 | Yamazaki |
| 2011/0121878 A1 | 5/2011 | Kato et al. |
| 2011/0199364 A1 | 8/2011 | Yamazaki et al. |
| 2011/0235389 A1 | 9/2011 | Kozuma et al. |
| 2012/0271984 A1 | 10/2012 | Ohmaru et al. |
| 2016/0140921 A1 | 5/2016 | Koyama et al. |

FOREIGN PATENT DOCUMENTS

| | | |
|---|---|---|
| EP | 0448350 A2 | 9/1991 |
| EP | 1 737 044 A1 | 12/2006 |
| EP | 2 226 847 A2 | 9/2010 |
| JP | 60-198861 A | 10/1985 |
| JP | 63-210022 A | 8/1988 |

(56) References Cited

FOREIGN PATENT DOCUMENTS

| JP | 63-210023 A | 8/1988 |
|---|---|---|
| JP | 63-210024 A | 8/1988 |
| JP | 63-215519 A | 9/1988 |
| JP | 63-239117 A | 10/1988 |
| JP | 63-265818 A | 11/1988 |
| JP | 04211819 A | 8/1992 |
| JP | 05-251705 A | 9/1993 |
| JP | 08-264794 A | 10/1996 |
| JP | 10078836 A | 3/1998 |
| JP | 11-505377 A | 5/1999 |
| JP | 2000-044236 A | 2/2000 |
| JP | 2000-150900 A | 5/2000 |
| JP | 2001093988 A | 4/2001 |
| JP | 2002-032163 A | 1/2002 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2010-122401 A | 6/2010 |
| JP | 2011-145666 A | 7/2011 |
| JP | 2011186451 A | 9/2011 |
| JP | 2011222985 A * | 11/2011 |
| JP | 2012256858 A | 12/2012 |
| KR | 2001015418 A | 2/2001 |
| TW | 462127 A | 11/2001 |
| TW | 201142800 A | 12/2011 |
| TW | 201201216 A | 1/2012 |
| WO | 2004/114391 A1 | 12/2004 |
| WO | WO-2011/074393 | 6/2011 |
| WO | 2011099359 A1 | 8/2011 |
| WO | 2011118351 A1 | 9/2011 |

OTHER PUBLICATIONS

Written Opinion (Application No. PCT/JP2012/080528) dated Feb. 26, 2013, in English.
Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.
Orita, M et al., "Amorphous transparent conductive oxide InGaO3(ZnO)m (m<4):a Zn4s conductor," Philosophical Magazine, 2001, vol. 81, No. 5, pp. 501-515.
Orita, M et al., "Mechanism of Electrical Conductivity of Transparent InGaZnO4," Phys. Rev. B (Physical Review. B), Jan. 15, 2000, vol. 61, No. 3, pp. 1811-1816.
Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.
Osada, T et al., "Development of Driver-Integrated Panel Using Amorphous In—Ga—Zn—Oxide TFT," AM-FPD '09 Digest of Technical Papers, Jul. 1, 2009, pp. 33-36.
Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.
Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.
Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.
Park, J et al., "High performance amorphous oxide thin film transistors with self-aligned top-gate structure," IEDM 09: Technical Digest of International Electron Devices Meeting, Dec. 7, 2009, pp. 191-194.
Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.
Park, J et al., "Amorphous Indium—Gallium—Zinc Oxide TFTs and Their Application for Large Size AMOLED," AM-FPD '08 Digest of Technical Papers, Jul. 2, 2008, pp. 275-278.
Park, S et al., "Challenge to Future Displays: Transparent AM-OLED Driven by Peald Grown ZnO TFT," IMID '07 Digest, 2007, pp. 1249-1252.
Prins, M et al., "A Ferroelectric Transparent Thin-Film Transistor," Appl. Phys. Lett. (Applied Physics Letters), Jun. 17, 1996, vol. 68, No. 25, pp. 3650-3652.
Sakata, J et al., "Development of 4.0-In. AMOLED Display With Driver Circuit Using Amorphous In—Ga—Zn—Oxide TFTS," IDW '09 : Proceedings of the 16th International Display Workshops, 2009, pp. 689-692.
Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.
Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.
Tsuda, K et al., "Ultra Low Power Consumption Technologies for Mobile TFT-LCDs," IDW '02 : Proceedings of the 9th International Display Workshops, Dec. 4, 2002, pp. 295-298.
Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.
Van De Walle, C, "Hydrogen as a Cause of Doping in Zinc Oxide," Phys. Rev. Lett. (Physical Review Letters), Jul. 31, 2000, vol. 85, No. 5, pp. 1012-1015.
Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; pp. 1805-1810; vol. 51, No. 11.
Wonchan Kim et al.; "An Experimental High-Density DRAM Cell with a Built-in Gain Stage"; IEEE Journal of Solid-State Circuits; Aug. 1, 1994; pp. 978-981; vol. 29, No. 8.
Shoji Shukuri et al.; "A Complementary Gain Cell Technology for Sub-1V Supply DRAMs"; IEDM 92: Technical Digest of International Electron Devices Meeting; Dec. 13, 1992; pp. 1006-1008.
Shoji Shukuri et al.; "A Semi-Static Complementary Gain Cell Technology for Sub-1 V Supply DRAM's"; IEEE Transactions on Electron Devices; Jun. 1, 1994; pp. 926-931; vol. 41, No. 6.
Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.
Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.
Clark, S et al., "First Principles Methods Using Castep," Zeitschrift fur Kristallographie, 2005, vol. 220, pp. 567-570.
Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

(56) References Cited

OTHER PUBLICATIONS

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using Cg-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] At Temperatures Over 1000° C.," Journal of Solid State Chemistry, 1985, vol. 60, pp. 382-384.

Kimizuka, N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Strucutre," NIRIM Newsletter, Mar. 1995, vol. 150, pp. 1-4 with English Translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

(56) References Cited

OTHER PUBLICATIONS

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTS With a Novel Passivation Layer," SID Digest '09 : SID International Symposium Digest of Technical Papers, May 31, 2009, pp. 284-287.

\* cited by examiner power supply voltage power supply voltage power supply voltage power supply voltage

SEMICONDUCTOR DISPLAY DEVICE

TECHNICAL FIELD

The present invention relates to an active-matrix semiconductor display device including a transistor in a pixel.

BACKGROUND ART

In recent years, a metal oxide having semiconductor characteristics called an oxide semiconductor has attracted attention as a novel semiconductor having high mobility provided by crystalline silicon and uniform element characteristics provided by amorphous silicon. The metal oxide is used for various applications. For example, indium oxide, which is a well-known metal oxide, is used for a light-transmitting pixel electrode in a liquid crystal display device, a light-emitting device, or the like. Examples of such a metal oxide having semiconductor characteristics include tungsten oxide, tin oxide, indium oxide, and zinc oxide. Transistors each including such a metal oxide having semiconductor characteristics in a channel formation region have been known (Patent Documents 1 and 2).

REFERENCE

Patent Document 1: Japanese Published Patent Application No. 2007-123861
Patent Document 2: Japanese Published Patent Application No. 2007-096055

DISCLOSURE OF INVENTION

Low power consumption is one of the important points in evaluating the performance of a semiconductor display device. In particular, in a portable electronic device such as a cellular phone, a semiconductor display device needs to consume less power because high power consumption of the semiconductor display device leads to a disadvantage of short continuous operating time.

In view of the above technical background, it is an object of the present invention to propose a semiconductor display device capable of consuming less power.

A semiconductor display device according to one embodiment of the present invention includes a pixel portion having a pixel; a driver circuit for controlling writing of an image signal having image data to the pixel portion; a panel controller for controlling the operation of the driver circuit; an image memory for storing the image data; a power supply controller for controlling supply of power supply voltage to a variety of circuits in the semiconductor display device; and a CPU for collectively controlling the operation of the panel controller, the image memory, and the power supply controller. In one embodiment of the present invention, in the case where one image is continuously displayed on the pixel portion, the driver circuit stops by stopping supply of power supply voltage to the driver circuit, and writing of an image signal to the pixel portion is stopped. After the driver circuit stops, supply of power supply voltage to the panel controller and the image memory is stopped, and supply of power supply voltage to the CPU is stopped.

In one embodiment of the present invention, an insulated gate field-effect transistor (hereinafter simply referred to as a transistor) whose off-state current is extremely low is provided in a pixel in order to continuously display an image on the pixel portion after writing of an image signal to the pixel portion is stopped. With the use of the transistor as an element for controlling supply of current or voltage to a display element included in the pixel, a period during which voltage or current is continuously supplied to the display element can be lengthened. Thus, for example, in the case where image signals having the same image data are repeatedly written to the pixel portion for some consecutive frame periods, as in a still image, an image can be continuously displayed even when drive frequency is lowered by temporarily stopping writing of an image signal to the pixel portion, that is, the writing number of an image signal for a certain period is reduced.

The transistor includes a semiconductor whose bandgap is wider than that of a silicon semiconductor in a channel formation region. With a channel formation region including a semiconductor having the above characteristics, a transistor whose off-state current is extremely low can be obtained. Such a semiconductor can be, for example, an oxide semiconductor whose bandgap is approximately 2 or more times that of silicon. With the use of a transistor having the above structure as a switching element for holding voltage applied to a display element, leakage of an electric charge from the display element can be prevented.

Note that in a volatile storage device used as a register, a cache memory, or the like in the CPU, when supply of power supply voltage to the CPU is stopped, data retained is lost. Thus, before the supply of power supply voltage to the CPU is stopped, it is necessary to back up data retained in a storage device such as a register or a cache memory to a nonvolatile external storage device such as a flash memory. However, it takes time to recover the data from the external storage device to the storage device in the CPU. Thus, in a short period during which a still image is displayed, it is difficult to back up data to an external storage device such as a hard disk or a flash memory in order to stop supply of power supply voltage for the purpose of reducing power consumption.

Thus, in one embodiment of the present invention, a storage device having the following structure is provided in the CPU. The storage device includes a first memory circuit and a second memory circuit for storing data in the first memory circuit. The second memory circuit includes a storage for storing data by accumulation of an electric charge, and a transistor for holding the electric charge accumulated in the storage. The storage includes a capacitor or a transistor, and the electric charge is accumulated in the capacitor or gate capacitance of the transistor. Further, in one embodiment of the present invention, as the transistor for holding an electric charge, the above transistor whose off-state current is extremely low is used. Note that the first memory circuit can be formed using a logic element that inverts the polarity of a signal input and outputs the signal, such as an inverter or a clocked inverter.

In the CPU, a variety of data retained in the first memory circuit is backed up to the second memory circuit before supply of power supply voltage to the CPU is stopped. Specifically, the data is backed up by holding an electric charge in the storage. The electric charge is held by turning off the transistor whose off-state current is low. After the supply of power supply voltage to the CPU is restarted, the backup data is recovered to the first memory circuit. With the above structure, the data in the storage device can be prevented from being lost even when the supply of power supply voltage is stopped. Thus, before the supply of power supply voltage to the CPU is stopped, it is not necessary to back up data to an external memory circuit. Accordingly, in the CPU, supply of power supply voltage can be stopped even on the millisecond time scale. Consequently, the semiconductor display device can consume less power.

In one embodiment of the present invention, with the above structure, a low-power semiconductor display device can be obtained.

BEST MODE FOR CARRYING OUT THE INVENTION

Embodiments of the present invention will be described in detail below with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments.

Note that the category of semiconductor display devices of the present invention includes liquid crystal display devices, light-emitting devices in which a light-emitting element typified by an organic light-emitting element (OLED) is provided for each pixel, electronic paper, digital micromirror devices (DMDs), plasma display panels (PDPs), field emission displays (FEDs), and other semiconductor display devices in which transistors are included in pixel portions.

Embodiment 1

Figure 1:
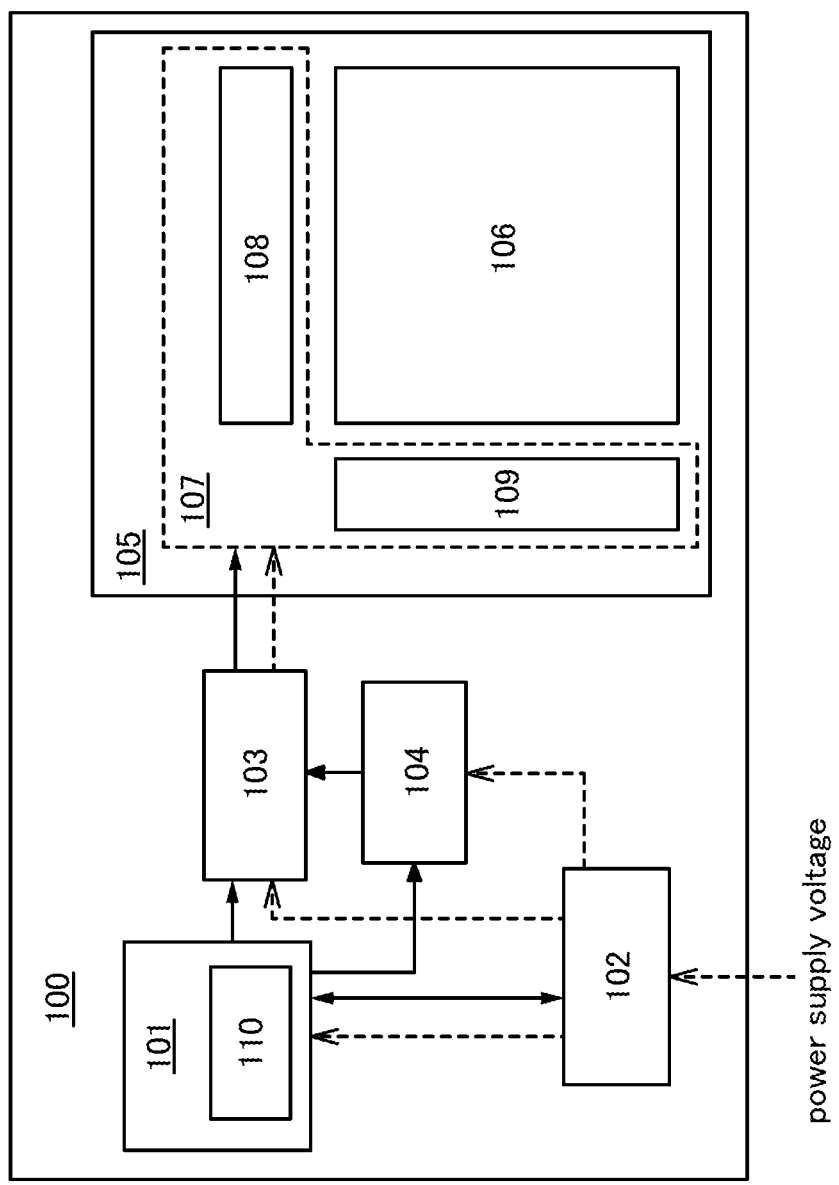
FIG. 1 is a block diagram illustrating the structure of a semiconductor display device.

FIG. 1 illustrates a block diagram of a semiconductor display device according to one embodiment of the present invention. Note that in this specification, in a block diagram, circuits are classified by their functions and independent blocks are illustrated. However, it is difficult to classify actual circuits by their functions completely and, in some cases, one circuit has a plurality of functions.

As illustrated in FIG. 1, a semiconductor display device 100 according to one embodiment of the present invention includes a CPU 101, a power supply controller 102, a panel controller 103, an image memory 104, and a panel 105. Further, the panel 105 includes a pixel portion 106 having a display element in each pixel and a driver circuit 107 for controlling the operation of the pixel portion 106. The driver circuit 107 includes a signal line driver circuit 108, a scan line driver circuit 109, and the like.

The CPU 101 has a function of collectively controlling the operation of the power supply controller 102, the panel controller 103, and the image memory 104. Further, the CPU 101 includes a storage device 110 functioning as a buffer storage device such as a register or a cache memory. The storage device 110 stores frequently used data or a frequently used program that is needed for the CPU 101 to operate.

The power supply controller 102 has a function of determining whether to supply power supply voltage and drive signals to the CPU 101, the panel controller 103, and the image memory 104 in response to an instruction from the CPU 101.

Image data is stored in the image memory 104. A volatile or nonvolatile storage device can be used as the image memory 104. For example, a volatile storage device such as a dynamic random access memory (DRAM) or a static random access memory (SRAM) can be used as the image memory 104. Note that in the case where the storage device used as the image memory 104 is nonvolatile, the image data is retained even when supply of power supply voltage is stopped. Thus, in the case where images to be displayed are the same before the stop of supply of power supply voltage and after the restart of supply of power supply voltage, it is not necessary to read image data again after the restart of the supply of power supply voltage. Accordingly, power consumption can be reduced.

For example, as the nonvolatile storage device, it is possible to use a storage device that has a transistor functioning as a switching element in each memory cell. The transistor has a semiconductor whose bandgap is wider than that of silicon and whose intrinsic carrier density is lower than that of silicon in a channel formation region. The storage device has higher speed of image data writing and image data reading than a general nonvolatile storage device such as a flash memory; thus, the storage device is suited for the image memory 104 that needs to operate at high speed.

The panel controller 103 reads image data from the image memory 104 in response to an instruction from the CPU 101 and generates an image signal containing the image data. Further, the panel controller 103 generates a drive signal that is synchronized with an image signal in response to an instruction from the CPU 101. The panel controller 103 has a function of supplying an image signal and a drive signal to the panel 105. Further, the panel controller 103 has a function of determining whether to supply power supply voltage from the power supply controller 102 to the driver circuit 107 in response to an instruction from the CPU 101.

An image signal from the panel controller 103 is supplied to the signal line driver circuit 108. In addition, drive signals from the panel controller 103 are supplied to the signal line driver circuit 108 and the scan line driver circuit 109.

Note that the CPU 101 may have a function of performing image processing on image data stored in the image memory 104.

Although the drive signal is a signal for controlling the operation of a variety of circuits by a pulse, the kind of drive signal needed for the operation varies depending on the structure of the circuit. Examples of a drive signal of the driver circuit 107 include a signal line driver circuit start pulse signal (SSP) and a signal line driver circuit clock signal (SCK) that control the operation of the signal line driver circuit 108 and a scan line driver circuit start pulse signal (GSP) and a scan line driver circuit clock signal (GCK) that control the operation of the scan line driver circuit 109. The signal line driver circuit 108 and the scan line driver circuit 109 operate by supply of power supply voltage and drive signals from the panel controller 103.

Examples of drive signals of the CPU 101 and the panel controller 103 include a clock signal CK. The CPU 101 and the panel controller 103 operate by supply of power supply voltage and drive signals from the power supply controller 102.

Next, an operation example of the semiconductor display device 100 according to one embodiment of the present invention is described taking the semiconductor display device in FIG. 1 as an example.

Figure 2A:
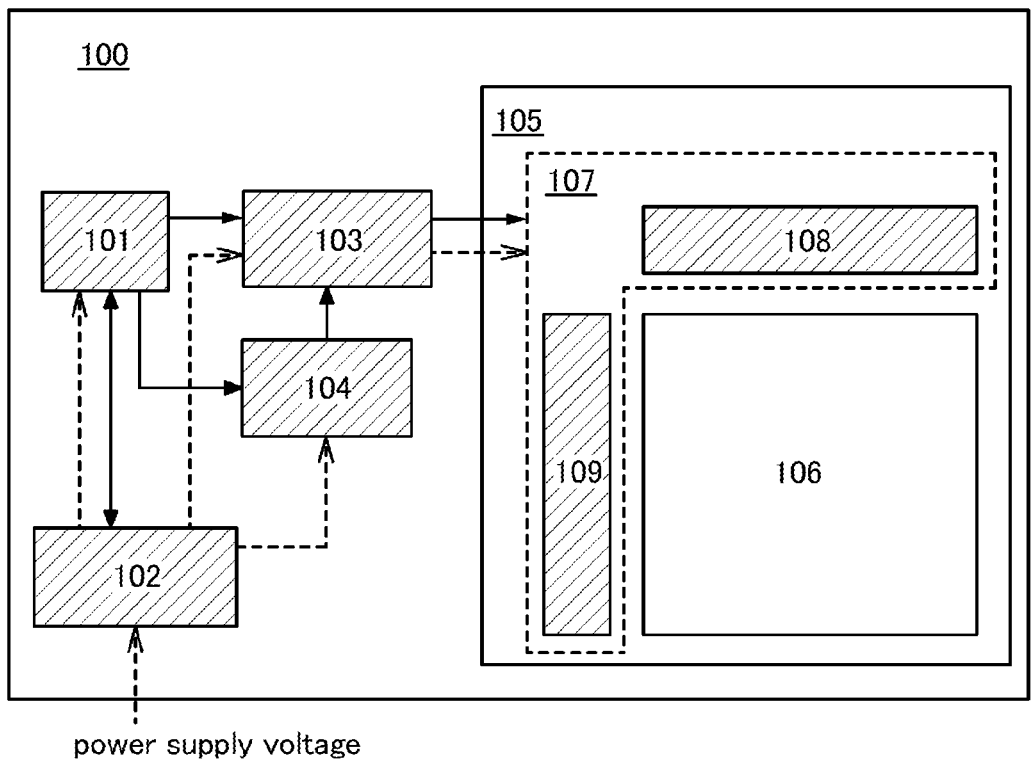
FIGS. 2A and 2B illustrate the operation of the semiconductor display device.

The semiconductor display device 100 can employ a driving method by which the CPU 101, the panel controller 103, the image memory 104, and the driver circuit 107 continuously operate (hereinafter this driving method is referred to as a first driving method) and a driving method by which the CPU 101, the panel controller 103, the image memory 104, and the driver circuit 107 intermittently operate by provision of a period during which the CPU 101, the panel controller 103, the image memory 104, and the driver circuit 107 stop (hereinafter this driving method is referred to as a second driving method). In the first driving method, the CPU 101, the panel controller 103, the image memory 104, and the driver circuit 107 operate after an image signal is written to the pixel portion 106 before another image signal is written to the pixel portion 106. Thus, as illustrated in FIG. 2A, in the first driving method, power supply voltage is continuously supplied to the CPU 101, the panel controller 103, and the image memory 104 from the power supply controller 102.

In addition, in the case where an image to be displayed on the pixel portion 106 is a still image, for example, the semiconductor display device 100 can employ the second driving method. In the second driving method, the drive frequency of the signal line driver circuit 108 and the scan line driver circuit 109 can be lowered as compared to the first driving method. Specifically, in the second driving method, the CPU 101 instructs the panel controller 103 to stop supply of power supply voltage and a drive signal to the driver circuit 107.

Figure 2B:
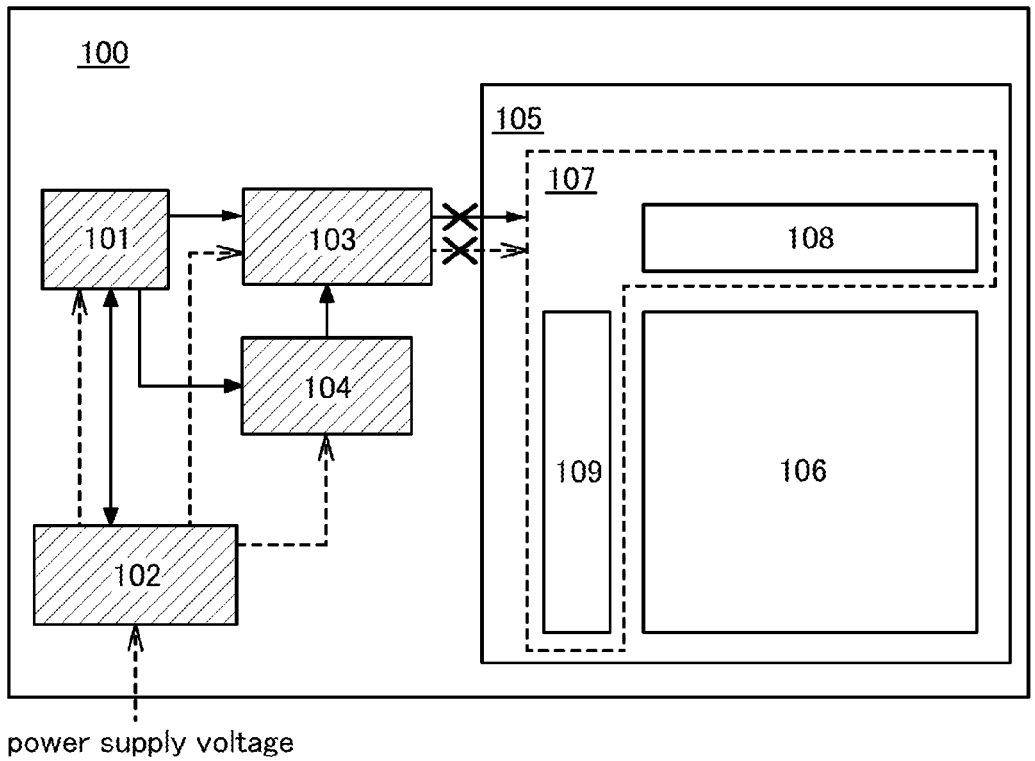

As illustrated in FIG. 2B, when the panel controller 103 stops supplying power supply voltage and a drive signal to the driver circuit 107 in response to the instruction, the driver circuit 107 stops. Note that the supply of a drive signal to the driver circuit 107 and the supply of power supply voltage to the driver circuit 107 may be stopped at the same time or may be stopped sequentially. In the case where the supply of power supply voltage to the driver circuit 107 is stopped after the supply of a drive signal to the driver circuit 107 is stopped, the driver circuit 107 can stop without malfunctioning.

Figure 3A:
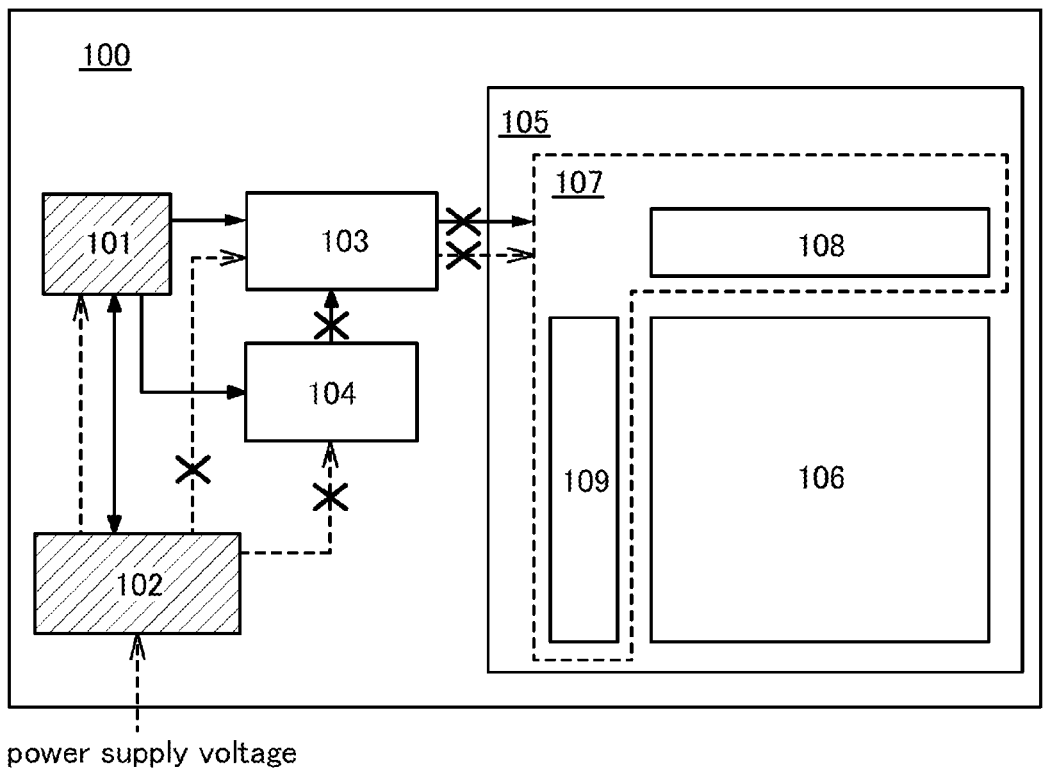
FIGS. 3A and 3B illustrate the operation of the semiconductor display device.

Then, after the driver circuit 107 stops, the CPU 101 instructs the power supply controller 102 to stop supply of power supply voltage and drive signals to the panel controller 103 and the image memory 104. As illustrated in FIG. 3A, when the power supply controller 102 stops supplying power supply voltage and drive signals to the panel controller 103 and the image memory 104 in response to the instruction, the panel controller 103 and the image memory 104 stop.

Note that the supply of drive signals to the panel controller 103 and the image memory 104 and the supply of power supply voltage to the panel controller 103 and the image memory 104 may be stopped at the same time or may be stopped sequentially. As in the driver circuit 107, in the case where the supply of power supply voltage to the panel controller 103 and the image memory 104 is stopped after the supply of drive signals to the panel controller 103 and the image memory 104 is stopped, the panel controller 103 and the image memory 104 can stop without malfunctioning.

Figure 3B:
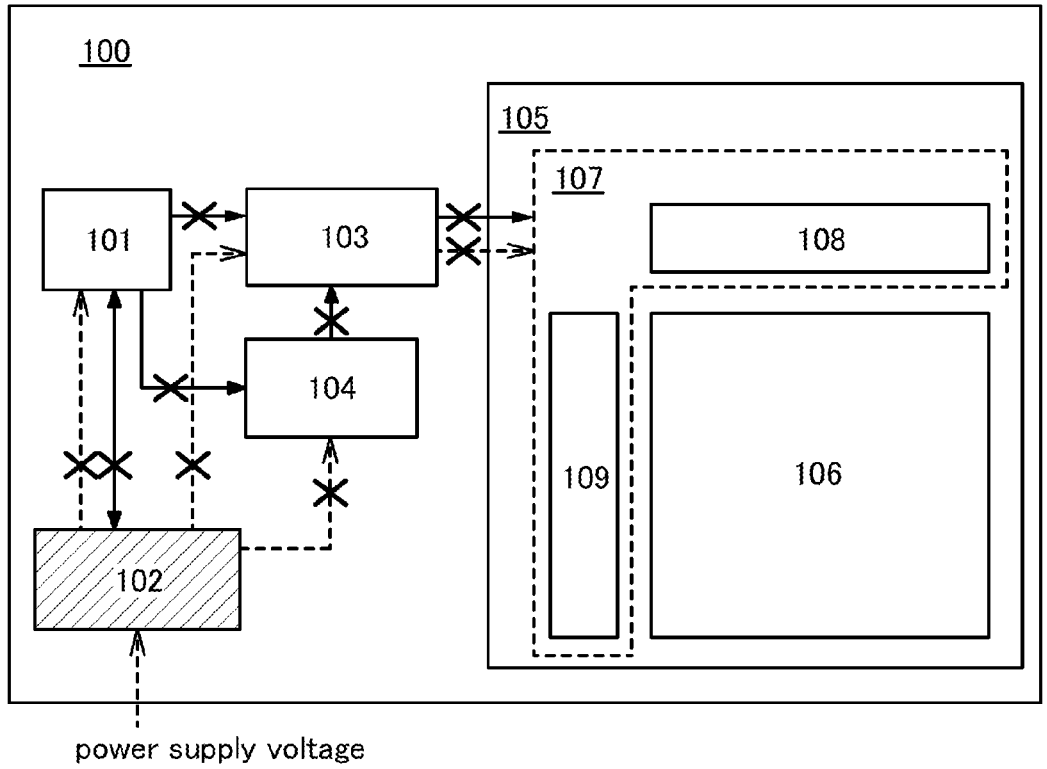

After the panel controller 103 and image memory 104 stop, the CPU 101 instructs the power supply controller 102 to stop supply of power supply voltage and a drive signal to the CPU 101. As illustrated in FIG. 3B, when the power supply controller 102 stops supplying power supply voltage and a drive signal to the CPU 101 in response to the instruction, the CPU 101 stops.

Note that the supply of a drive signal to the CPU 101 and the supply of power supply voltage to the CPU 101 may be stopped at the same time or may be stopped sequentially. As in the driver circuit 107, the panel controller 103, and the image memory 104, in the case where the supply of power supply voltage to the CPU 101 is stopped after the supply of a drive signal to the CPU 101 is stopped, the CPU 101 can stop without malfunctioning.

With the series of operation, the supply of power supply voltage or drive signals to the CPU 101, the panel controller 103, the image memory 104, and the driver circuit 107 is stopped. The supply of power supply voltage or drive signals is stopped until writing of another image signal to the pixel portion 106 is started.

In the case where writing of an image signal to the pixel portion 106 is restarted, a writing instruction of an image signal is input from an input device or the like to the CPU 101 and the power supply controller 102. The power supply controller 102 restarts supply of power supply voltage and drive signals to the CPU 101, the panel controller 103, and the image memory 104 in response to the writing instruction of an image signal.

Specifically, first, the power supply controller 102 restarts supply of power supply voltage and a drive signal to the CPU 101 in response to the writing instruction of an image signal. The CPU 101 operates again by the restart of the supply of power supply voltage. The supply of a drive signal to the CPU 101 and the supply of power supply voltage to the CPU 101 may be restarted at the same time or may be restarted sequentially. Note that in the case where the supply of a drive signal to the CPU 101 is restarted after the supply of power supply voltage to the CPU 101 is restarted, the CPU 101 can operate without malfunctioning.

Then, the CPU 101 instructs the power supply controller 102 to supply power supply voltage and drive signals to the panel controller 103 and the image memory 104. The power supply controller 102 restarts supply of power supply voltage and drive signals to the panel controller 103 and the image memory 104 in response to the instruction. The panel controller 103 and the image memory 104 operate again by the restart of the supply of power supply voltage and drive signals.

Note that the supply of drive signals to the panel controller 103 and the image memory 104 and the supply of power supply voltage to the panel controller 103 and the image memory 104 may be restarted at the same time or may be restarted sequentially. In the case where the supply of drive signals to the panel controller 103 and the image memory 104 is restarted after the supply of power supply voltage to the panel controller 103 and the image memory 104 is restarted, the panel controller 103 and the image memory 104 can operate without malfunctioning.

Then, the CPU 101 instructs the panel controller 103 to supply power supply voltage and a drive signal to the driver circuit 107. The panel controller 103 restarts supply of power supply voltage and a drive signal to the driver circuit 107 in response to the instruction, so that the driver circuit 107 operates again. The supply of a drive signal to the driver circuit 107 and the supply of power supply voltage to the driver circuit 107 may be restarted at the same time or may be restarted sequentially. Note that as in the CPU 101, the panel controller 103, and the image memory 104, in the case where the supply of a drive signal to the driver circuit 107 is restarted after the supply of power supply voltage to the driver circuit 107 is restarted, the driver circuit 107 can operate without malfunctioning.

With the series of operation, the supply of power supply voltage to the CPU 101, the panel controller 103, the image memory 104, and the driver circuit 107 is restarted.

Note that in one embodiment of the present invention, the second driving method is applicable not only to the case where a still image is displayed but also to the case where a moving image is displayed by regular rewriting of an image signal.

In one embodiment of the present invention, by repeating the stop and restart of supply of power supply voltage as described above, the semiconductor display device 100 can consume less power as compared to the case where power supply voltage is continuously supplied to the CPU 101, the panel controller 103, the image memory 104, and the driver circuit 107.

Figure 4A:
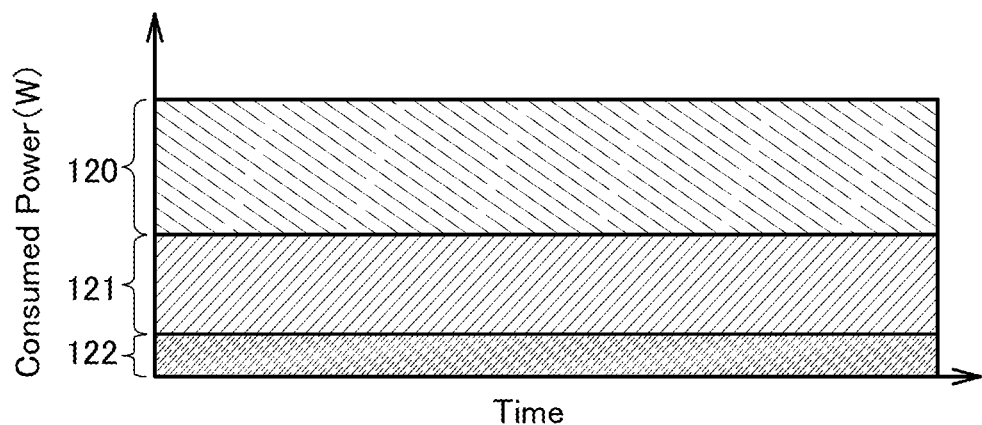
FIGS. 4A to 4C illustrate time changes in power.

FIG. 4A schematically illustrates time changes in consumed power 120 in the driver circuit 107, consumed power 121 in the panel controller 103 and the image memory 104, and consumed power 122 in the CPU 101. FIG. 4A illustrates the case where power supply voltage is continuously supplied to the CPU 101, the panel controller 103, the image memory 104, and the driver circuit 107.

In the case of FIG. 4A, the semiconductor display device 100 continuously consumes the predetermined consumed power 120 to 122.

Figure 4B:
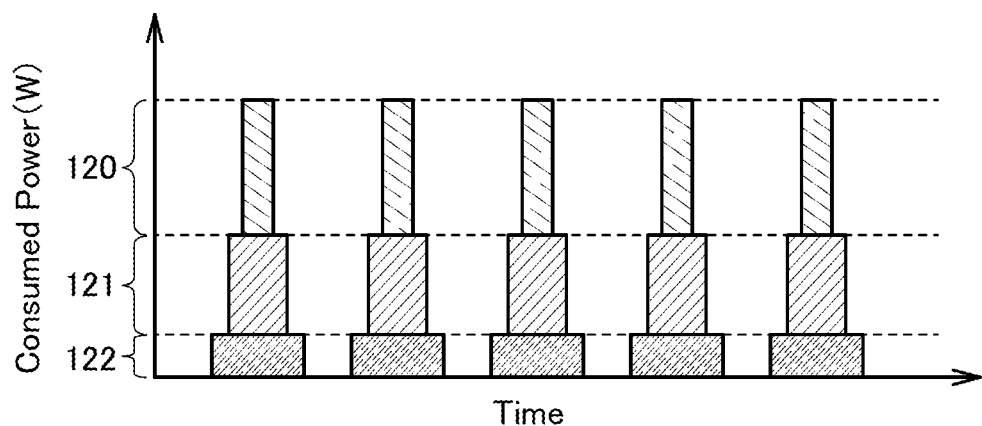

FIG. 4B schematically illustrates time changes in the consumed power 120 in the driver circuit 107, the consumed power 121 in the panel controller 103 and the image memory 104, and the consumed power 122 in the CPU 101. FIG. 4B illustrates the case where power supply voltage is intermittently supplied to the CPU 101, the panel controller 103, the image memory 104, and the driver circuit 107.

As described above, in one embodiment of the present invention, supply of power supply voltage is stopped sequentially from the driver circuit 107, the panel controller 103 and the image memory 104, and the CPU 101. In addition, in one embodiment of the present invention, the supply of power supply voltage is restarted sequentially from the CPU 101, the panel controller 103 and the image memory 104, and the driver circuit 107. Thus, in one embodiment of the present invention, as illustrated in FIG. 4B, the predetermined consumed power 120 is intermittently consumed. In a period during which the predetermined consumed power 120 is consumed, an image signal is written. In one embodiment of the present invention, as illustrated in FIG. 4B, the predetermined consumed power 121 is intermittently consumed. The period during which the predetermined consumed power 120 is consumed is included in a period during which the predetermined consumed power 121 is consumed. In one embodiment of the present invention, as illustrated in FIG. 4B, the predetermined consumed power 122 is intermittently consumed. The period during which the predetermined consumed power 121 is consumed and the period during which the predetermined consumed power 120 is consumed are included in a period during which the predetermined consumed power 122 is consumed.

In the case of FIG. 4B, the consumed power 120, the consumed power 121, and the consumed power 122 are intermittently consumed; thus, the total power consumption of the semiconductor display device 100 can be made lower as compared to the case of FIG. 4A.

Note that in one embodiment of the present invention, in the case where an external device requires the semiconductor display device 100 to notify the operating state of the semiconductor display device 100, for example, only the CPU 101 might operate even in a period during which an image signal in not written. In that case, the supply of power supply voltage to the CPU 101 is restarted in response to an instruction from the input device or the like; however, the supply of power supply voltage to the panel controller 103 and the image memory 104 and the supply of power supply voltage to the driver circuit 107 may be continuously stopped.

Figure 4C:
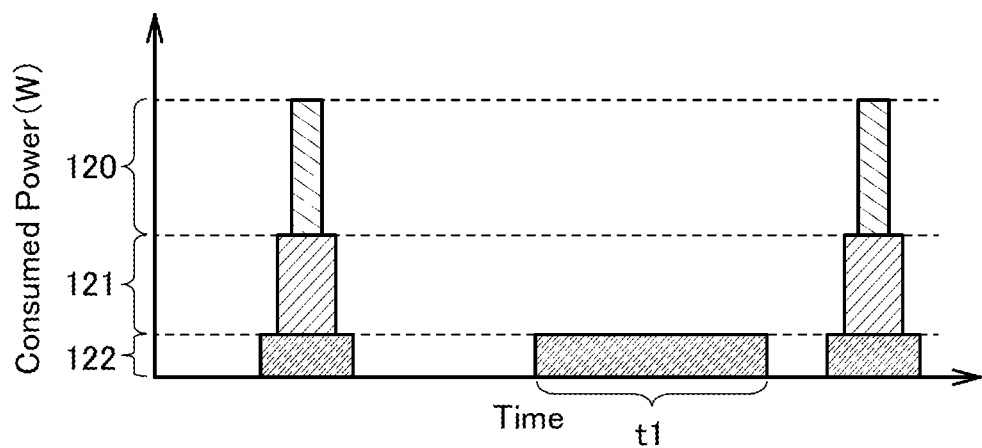

FIG. 4C schematically illustrates time changes in the consumed power 120 in the driver circuit 107, the consumed power 121 in the panel controller 103 and the image memory 104, and the consumed power 122 in the CPU 101. FIG. 4C illustrates the case where power supply voltage is intermittently supplied to the CPU 101, the panel controller 103, the image memory 104, and the driver circuit 107, which is different from the case in FIG. 4B.

In FIG. 4C, power supply voltage is supplied to the CPU 101 during a period t1. In addition, in FIG. 4C, supply of power supply voltage to the panel controller 103 and the image memory 104 and supply of power supply voltage to the driver circuit 107 are stopped during the period t1. Thus, during the period t1, the predetermined consumed power 122 is consumed. Also in the case of FIG. 4C, the consumed power 120, the consumed power 121, and the consumed power 122 are intermittently consumed; thus, the total power consumption of the semiconductor display device 100 can be made lower as compared to the case of FIG. 4A.

Next, a specific structure of the pixel portion 106 is described taking the case where the semiconductor display device 100 is a liquid crystal display device as an example.

Figure 5A:
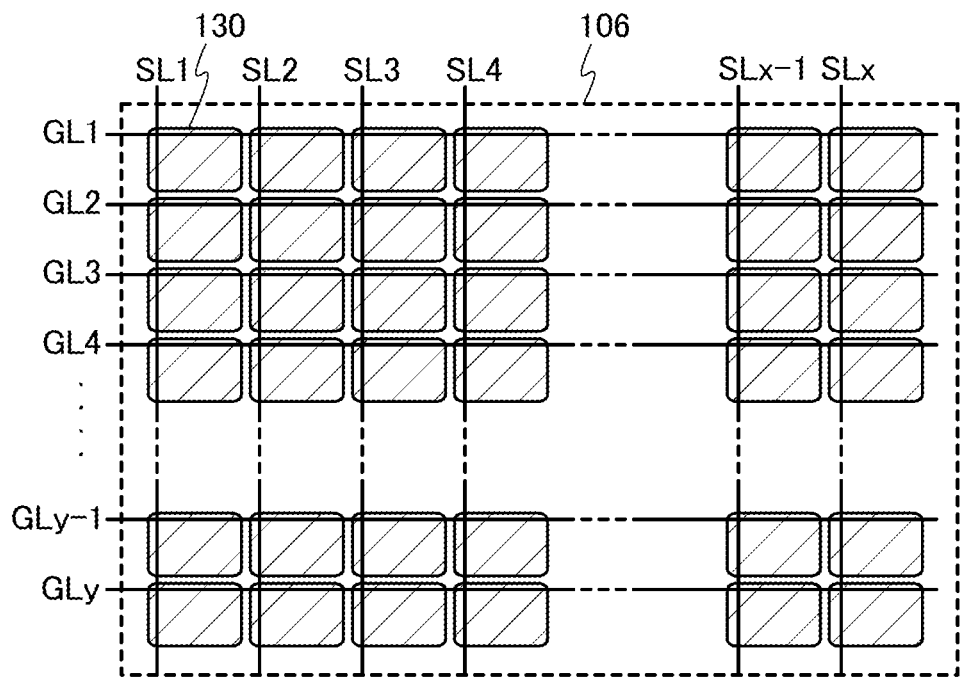
FIG. 5A illustrates the structure of a pixel portion.

FIG. 5A illustrates a structure example of the pixel portion 106. In FIG. 5A, y scan lines GL (GL1 to GLy) whose potentials are controlled by the scan line driver circuit and x signal lines SL (SL1 to SLx) whose potentials are controlled by the signal line driver circuit are provided in the pixel portion 106.

Each scan line GL is connected to a plurality of pixels 130. Specifically, each scan line GL is connected to x pixels 130 arranged in a given row among the plurality of pixels 130 arranged in matrix.

Each signal line SL is connected to y pixels 130 arranged in a given column among the plurality of pixels 130 arranged in x columns and y rows in the pixel portion 106.

Note that in this specification, the term "connection" means electrical connection and corresponds to a state where current, voltage, or a potential can be supplied or transmitted. Accordingly, a connection state does not always mean a direct connection state but includes an indirect connection state through a circuit element such as a wiring, a resistor, a diode, or a transistor so that current, voltage, or a potential can be supplied or transmitted.

Note that even when independent components are connected to each other in a circuit diagram, there is the case where one conductive film has functions of a plurality of components, such as the case where part of a wiring functions as an electrode. The term "connection" in this specification also means such a case where one conductive film has functions of a plurality of components.

Figure 5B:
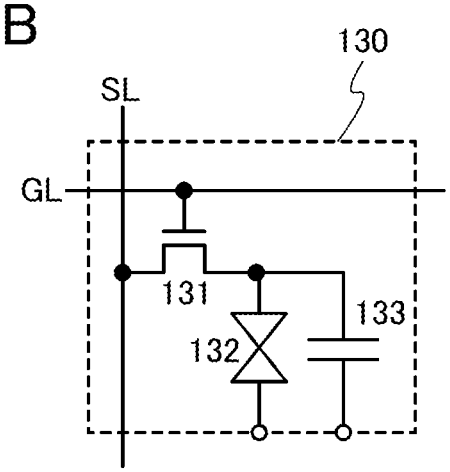
FIG. 5B is a circuit diagram of a pixel.

FIG. 5B is an example of a circuit diagram of the pixel 130. The pixel 130 in FIG. 5B includes a transistor 131 functioning as a switching element, a liquid crystal element 132 whose transmittance is controlled in response to the potential of an image signal supplied through the transistor 131, and a capacitor 133.

The liquid crystal element 132 includes a pixel electrode, a common electrode, and a liquid crystal layer having a liquid crystal to which voltage across the pixel electrode and the common electrode is applied. The capacitor 133 has a function of holding voltage across the pixel electrode and the common electrode of the liquid crystal element 132.

The liquid crystal layer can be formed using, for example, a liquid crystal material classified into a thermotropic liquid crystal or a lyotropic liquid crystal. Alternatively, the liquid crystal layer can be formed using, for example, a liquid crystal material classified into a nematic liquid crystal, a smectic liquid crystal, a cholesteric liquid crystal, or a discotic liquid crystal. Alternatively, the liquid crystal layer can be formed using, for example, a liquid crystal material classified into a ferroelectric liquid crystal or an anti-ferroelectric liquid crystal. Alternatively, the liquid crystal layer can be formed using, for example, a liquid crystal material classified into a high-molecular liquid crystal such as a main-chain high-molecular liquid crystal, a side-chain high-molecular liquid crystal, or a composite-type high-molecular liquid crystal, or a low-molecular liquid crystal. Alternatively, the liquid crystal layer can be formed using, for example, a liquid crystal material classified into a polymer dispersed liquid crystal (PDLC).

Alternatively, a liquid crystal exhibiting a blue phase for which an alignment film is not used may be used for the liquid crystal layer. A blue phase is one of liquid crystal phases that is generated just before a cholesteric phase changes into an isotropic phase while the temperature of a cholesteric liquid crystal is increased. Since the blue phase is only generated within a narrow range of temperature, a chiral material or an ultraviolet curable resin is added so that the temperature range is improved. A liquid crystal composition including a liquid crystal exhibiting a blue phase and a chiral material is preferable because it has a short response time of 1 ms or less, and is optically isotropic, which makes the alignment process unneeded and viewing angle dependence small.

The following can be used as a method for driving the liquid crystal: a twisted nematic (TN) mode, a super twisted nematic (STN) mode, a vertical alignment (VA) mode, a multi-domain vertical alignment (MVA) mode, an in-plane-switching (IPS) mode, an optically compensated birefringence (OCB) mode, a fringe field switching (FFS) mode, a blue phase mode, a transverse bend alignment (TBA) mode, a VA-IPS mode, an electrically controlled birefringence (ECB) mode, a ferroelectric liquid crystal (FLC) mode, an anti-ferroelectric liquid crystal (AFLC) mode, a polymer dispersed liquid crystal (PDLC) mode, a polymer network liquid crystal (PNLC) mode, a guest-host mode, and the like.

The pixel 130 may further include another circuit element such as a transistor, a diode, a resistor, a capacitor, or an inductor as needed.

Specifically, in FIG. 5B, a gate electrode of the transistor 131 is connected to the scan line GL. One of a source terminal and a drain terminal of the transistor 131 is connected to the signal line SL. The other of the source terminal and the drain terminal of the transistor 131 is connected to the pixel electrode of the liquid crystal element 132. One electrode of the capacitor 133 is connected to the pixel electrode of the liquid crystal element 132. The other electrode of the capacitor 133 is connected to a node to which a specific potential is applied. Note that a specific potential is applied to the common electrode of the liquid crystal element 132. The potential applied to the common electrode may be the same as the potential applied to the other electrode of the capacitor 133.

In the liquid crystal element 132, the alignment of liquid crystal molecules is changed in accordance with the level of voltage across the pixel electrode and the common electrode, so that the transmittance is changed. Accordingly, when the transmittance of the liquid crystal element 132 is controlled by the potential of an image signal input to the signal line SL, gradation can be expressed.

Note that a "source terminal" of a transistor means a source region that is part of an active layer or a source electrode that is connected to an active layer. Similarly, a "drain terminal" of a transistor means a drain region that is part of an active layer or a drain electrode that is connected to an active layer.

Although FIG. 5B illustrates the case where one transistor 131 is used as a switching element in the pixel 130, the present invention is not limited to this structure. A plurality of transistors functioning as one switching element may be used. In the case where a plurality of transistors function as one switching element, the plurality of transistors may be connected to each other in parallel, in series, or in combination of parallel connection and series connection.

In this specification, a state in which transistors are connected to each other in series means, for example, a state in which only one of a source terminal and a drain terminal of a first transistor is connected to only one of a source terminal and a drain terminal of a second transistor. In addition, a state in which transistors are connected to each other in parallel means a state in which one of a source terminal and a drain terminal of a first transistor is connected to one of a source terminal and a drain terminal of a second transistor and the other of the source terminal and the drain terminal of the first transistor is connected to the other of the source terminal and the drain terminal of the second transistor.

When the transistor 131 includes a wide bandgap semiconductor such as an oxide semiconductor in a channel formation region, the transistor 131 can have extremely low off-state current and high withstand voltage. Further, when the transistor 131 having the above structure is used as a switching element, leakage of an electric charge accumulated in the liquid crystal element 132 can be prevented effectively as compared to the case where a transistor including a normal semiconductor such as silicon or germanium is used.

Note that unless otherwise specified, in this specification, off-state current of an n-channel transistor is current that flows between a source terminal and a drain terminal when the potential of the drain terminal is higher than that of the source terminal or that of a gate electrode while the potential of the gate electrode is 0 V or lower in the case of the potential of the source terminal used as a reference. Alternatively, in this specification, off-state current of a p-channel transistor is current that flows between a source terminal and a drain terminal when the potential of the drain terminal is lower than that of the source terminal or that of a gate electrode while the potential of the gate electrode is 0 V or higher in the case of the potential of the source terminal used as a reference.

An oxide semiconductor preferably contains at least indium (In) or zinc (Zn). As a stabilizer for reducing variations in electrical characteristics of a transistor including the oxide semiconductor, the oxide semiconductor preferably contains gallium (Ga) in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

For example, indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used as an oxide semiconductor.

Note that, for example, an In—Ga—Zn-based oxide means an oxide containing In, Ga, and Zn, and there is no limitation on the ratio of In, Ga, and Zn. In addition, the In—Ga—Zn-based oxide may contain a metal element other than In, Ga, and Zn. The In—Ga—Zn-based oxide has sufficiently high resistance when no electric field is applied thereto, so that off-state current can be sufficiently reduced. Further, the In—Ga—Zn-based oxide has high mobility.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide whose composition is in the neighborhood of the above composition can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide whose composition is in the neighborhood of the above composition is preferably used.

For example, with an In—Sn—Zn-based oxide, high mobility can be comparatively easily obtained. However, even with an In—Ga—Zn-based oxide, mobility can be increased by lowering defect density in a bulk.

Note that a highly-purified oxide semiconductor (a purified oxide semiconductor) obtained by reduction of impurities such as moisture or hydrogen that serve as electron donors (donors) and reduction of oxygen vacancies is an intrinsic (i-type) semiconductor or a substantially intrinsic semiconductor. Thus, a transistor including the oxide semiconductor has extremely low off-state current. Further, the band gap of the oxide semiconductor is 2 eV or more, preferably 2.5 eV or more, more preferably 3 eV or more. With the use of an oxide semiconductor film that is highly purified by a sufficient decrease in concentration of impurities such as moisture or hydrogen and reduction of oxygen vacancies, the off-state current of the transistor can be decreased.

Specifically, various experiments can prove low off-state current of a transistor including a highly-purified oxide semiconductor for a semiconductor film. For example, even when an element has a channel width of $1 \times 10^6$ μm and a channel length of 10 μm, off-state current can be lower than or equal to the measurement limit of a semiconductor parameter analyzer, i.e., lower than or equal to $1 \times 10^{-13}$ A, at a voltage (drain voltage) between a source terminal and a drain terminal of 1 to 10 V. In that case, it can be seen that off-state current standardized on the channel width of the transistor is lower than or equal to 100 zA/μm. In addition, a capacitor and a transistor were connected to each other and off-state current was measured using a circuit in which electrical charge flowing to or from the capacitor is controlled by the transistor. In the measurement, a highly-purified oxide semiconductor film was used for a channel formation region of the transistor, and the off-state current of the transistor was measured from a change in the amount of electrical charge of the capacitor per unit hour. As a result, it can be seen that, in the case where the voltage between the source terminal and the drain terminal of the transistor is 3 V, a lower off-state current of several tens of yoctoamperes per micrometer (yA/μm) is obtained. Accordingly, the transistor including the highly-purified oxide semiconductor film for a channel formation region has much lower off-state current than a crystalline silicon transistor.

In one embodiment of the present invention, by using the transistor 131 whose off-state current is extremely low, a period during which voltage applied to the liquid crystal element 132 is held can be lengthened. Thus, for example, in the case where image signals having the same image data are written to the pixel portion 106 for some consecutive frame periods, as in a still image, an image can be continuously displayed even when drive frequency is lowered, that is, the writing number of an image signal for a certain period is reduced. For example, by using the transistor 131 including a highly purified oxide semiconductor in the channel formation region, the write cycle of an image signal can be 10 seconds or longer, preferably 30 seconds or longer, more preferably 1 minute or longer. As the write cycle of an image signal is made longer, power consumption can be further reduced.

In addition, since the potential of an image signal can be held for a longer period, the quality of an image to be displayed can be prevented from being lowered even when the capacitor 133 for holding the potential of the image signal is not connected to the liquid crystal element 132. Thus, it is possible to increase the aperture ratio by omitting the capacitor 133 or reducing the size of the capacitor 133, which leads to a reduction in power consumption of the semiconductor display device 100.

By inversion driving by which the polarity of the potential of an image signal is inverted using the potential of a common electrode as a reference, degradation of a liquid crystal material called burn—in can be prevented. However, in the inversion driving, a change in potential applied to the signal line SL is increased at the time of the change in the polarity of the image signal; thus, a potential difference between the source terminal and the drain terminal of the transistor 131 functioning as a switching element is increased. Accordingly, the transistor 131 easily causes degradation in characteristics, such as a shift in threshold voltage. Further, in order to maintain the voltage held in the liquid crystal element 132, the off-state current needs to be low even when the potential difference between the source terminal and the drain terminal is large. When a semiconductor having a wider bandgap and lower intrinsic carrier density is wider than silicon or germanium, such as an oxide semiconductor, is used for the transistor 131, the withstand voltage of the transistor 131 can be increased and the off-state current can be made extremely low. Thus, as compared to the case where a transistor including a normal semiconductor such as silicon or germanium is used, degradation of the transistor 131 can be prevented and the voltage held in the liquid crystal element 132 can be maintained.

An oxide semiconductor film can be single crystal, polycrystalline (also referred to as polycrystal), or amorphous, for example. The oxide semiconductor film is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits into a cube whose one side is less than 100 nm. From an observation image obtained with a transmission electron microscope (TEM), a boundary between the amorphous part and the crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic order which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85 to 95°. In addition, a simple term "parallel" includes a range from −5 to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the CAAC-OS film is higher than that in the vicinity of the surface where the CAAC-OS film is formed in some cases. Further, when an impurity is added to the CAAC-OS film, the crystal part in a region to which the impurity is added becomes amorphous in some cases.

Since the c-axes of the crystal parts in the CAAC-OS film are aligned in the direction parallel to the normal vector of the surface where the CAAC-OS film is formed or the normal vector of the surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the c-axis direction of the crystal part is the direction parallel to the normal vector of the surface where the CAAC-OS film is formed or the normal vector of the surface of the CAAC-OS film. The crystal part is formed by deposition or by performing treatment for crystallization such as heat treatment after deposition.

In a transistor including a CAAC-OS film, a change in electrical characteristics due to irradiation with visible light or ultraviolet light is small. Thus, the transistor has high reliability.

For example, a CAAC-OS film is deposited by sputtering with a polycrystalline oxide semiconductor sputtering target. When ions collide with the sputtering target, a crystal region included in the sputtering target may be separated from the target along the a-b plane, and a sputtered particle having a plane parallel to the a-b plane (a flat-plate-like sputtered particle or a pellet-like sputtered particle) might be separated from the sputtering target. In that case, the flat-plate-like sputtered particle reaches a substrate while maintaining its crystal state, so that the CAAC-OS film can be deposited.

For the deposition of the CAAC-OS film, the following conditions are preferably employed.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in a deposition chamber may be reduced. Further, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle occurs after the sputtered particle reaches the substrate. Specifically, the substrate heating temperature during the deposition is 100° C. or higher and 740° C. or lower, preferably 200° C. or higher and 500° C. or lower. By increasing the substrate heating temperature during the deposition, when the flat-plate-like sputtered particle reaches the substrate, migration occurs on the substrate, so that a flat plane of the sputtered particle is attached to the substrate.

Further, it is preferable to reduce plasma damage during the deposition by increasing the proportion of oxygen in the deposition gas and optimizing power. The proportion of oxygen in the deposition gas is 30 vol % or higher, preferably 100 vol %.

As an example of the sputtering target, an In—Ga—Zn-based oxide target is described below.

A polycrystalline In—Ga—Zn-based oxide target is made by mixing $InO_X$ powder, $GaO_Y$ powder, and $ZnO_Z$ powder in a predetermined mole ratio, applying pressure, and performing heat treatment at 1000° C. or higher and 1500° C. or lower. Note that X, Y, and Z are each a given positive number. Here, the predetermined mole ratio of the $InO_X$ powder, the $GaO_Y$ powder, and the $ZnO_Z$ powder is, for example, 2:2:1, 8:4:3, 3:1:1, 1:1:1, 4:2:3, or 3:1:2. The kinds of powder and the mole ratio for mixing powder may be changed as appropriate depending on a sputtering target to be formed.

Figure 6:
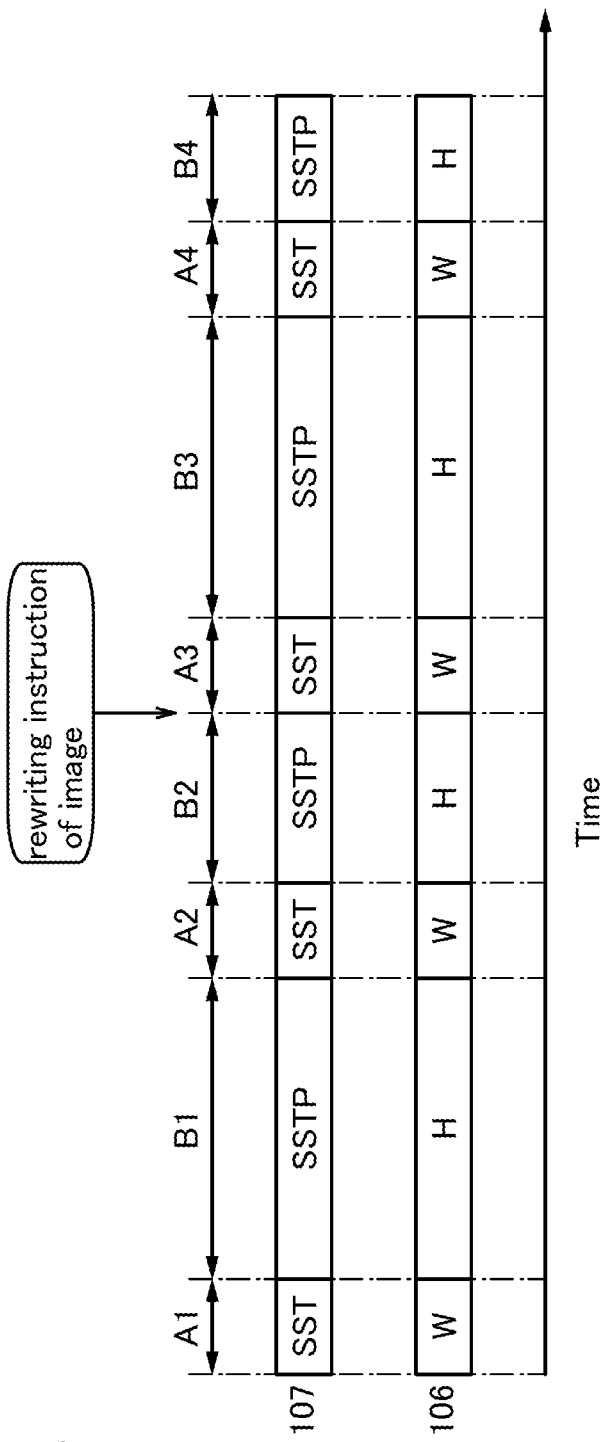
FIG. 6 is a timing chart illustrating the operation of the semiconductor display device.

Next, operation examples of the pixel portion 106 and the driver circuit 107 are described with reference to FIG. 6. FIG. 6 schematically illustrates time changes in operating states of the pixel portion 106 and the driver circuit 107.

In the second driving method, a period A during which an image signal is written to the pixel portion 106 and a period B during which a display element (e.g., the liquid crystal element 132) continuously expresses gradation by the image signal appear alternately. FIG. 6 illustrates the case where four periods A (periods A1 to A4) and four periods B (periods B1 to B4) appear alternately. Specifically, in FIG. 6, the periods appear in the following order: the period A1, the period B1, the period A2, the period B2, the period A3, the period B3, the period A4, and the period B4.

In the period A, a drive signal and power supply voltage are supplied to the driver circuit 107, so that driver circuits (e.g., the signal line driver circuit 108 and the scan line driver circuit 109) operate. In FIG. 6, a state in which the driver circuit 107 operates is denoted by SST.

When the scan line driver circuit 109 operates, the pixels 130 that are connected to the scan lines GL of the pixel portion 106 are sequentially selected by the scan line driver circuit 109. Specifically, in the case of the pixels 130 in FIG. 5B, the transistors 131 that are connected to the scan lines GL are turned on. When the signal line driver circuit 108 operates, an image signal is input from the signal line driver circuit 108 to the pixel 130 selected by the scan line driver circuit 109. Specifically, in the case of the pixel 130 in FIG. 5B, the potential of an image signal is applied to the pixel electrode of the liquid crystal element 132 through the transistor 131 that is on.

The input of an image signal to the pixel portion 106 is similarly performed on the other pixels 130. A display state is set in all the pixels 130, and an image based on the image data of the image signal is displayed on the entire pixel portion 106. A state in which the image signal is written to pixel portion 106 and a display state is set is denoted by W in FIG. 6.

Next, in the period B, the supply of a drive signal and power supply voltage to the driver circuit 107 is stopped, so that the driver circuits (e.g., the signal line driver circuit 108 and the scan line driver circuit 109) stop. In FIG. 6, a state in which the driver circuit 107 stops operation is denoted by SSTP. When the signal line driver circuit 108 stops, the input of an image signal to the pixel portion 106 is stopped.

In addition, when the scan line driver circuit 109 stops, the selection of the pixel portion 106 by the scan line driver circuit 109 is stopped. Thus, the display element included in the pixel portion 106 holds a display state set in the previous period A. A state in which gradation is continuously expressed by the display element is denoted by H in FIG. 6.

Specifically, in FIG. 6, a display state set in the period A1 is held in the period B1. A display state set in the period A2 is held in the period B2. A display state set in the period A3 is held in the period B3. A display state set in the period A4 is held in the period B4.

In one embodiment of the present invention, as described above, the transistor 131 whose off-state current is extremely low is used; thus, the display state in each period B can be held for 10 seconds or longer, preferably 30 seconds or longer, more preferably 1 minute or longer.

In one embodiment of the present invention, the length of the period B can be changed as appropriate in response to a rewriting instruction of an image from the input device or the like. For example, FIG. 6 illustrates the case where timing of the end of the period B2 is set by a rewriting instruction of an image. In FIG. 6, the period B2 is forcibly ended by the rewriting instruction of an image, and then, the period A3 is started. Accordingly, in the case of FIG. 6, the period B2 is shorter than the period B that is automatically ended regardless of the rewriting instruction of an image, for example, the period B1 or the period B3.

Note that there is a limitation on a period during which the display element can maintain a display state. Accordingly, in consideration of the period during which the display element can maintain a display state, the maximum length of the period B in a period during which a rewriting instruction of an image is not input is set in advance. In other words, in the case where a period during which a still image is displayed is longer than the maximum length of the period B, the period B is automatically ended even when there is no input of a rewriting instruction of an image. Then, the same image signal is rewritten to the pixel portion 106 in the next period A, and the image held in the previous period B is displayed again on the pixel portion 106.

In one embodiment of the present invention, in the second driving method, the writing number of an image signal to the pixel portion 106 can be greatly reduced while the image is continuously displayed. Accordingly, the drive frequency of the driver circuit can be greatly reduced, and the semiconductor display device 100 can consume less power.

Note that as in the second driving method, in the first driving method, an image signal is written to the pixel portion 106. Then, the display element expresses gradation in response to the image signal. However, unlike in the second driving method, after image signals are written to the entire pixel portion 106 and a display state is set, the driver circuit 107 does not necessarily stop.

Next, drive signals and power supply voltage transmitted from the panel controller 103 to the driver circuit 107 in the second driving method in the semiconductor display device 100 in FIG. 1 are described.

Power supply voltage Vp is supplied from the power supply controller 102 to the panel controller 103. Further, a drive signal such as a clock signal CK is input from the power supply controller 102 to the panel controller 103. The panel controller 103 has a function of generating a variety of power supply voltages and drive signals with the use of the input clock signal CK and power supply voltage Vp and supplying the power supply voltages and drive signals to the scan line driver circuit 109 or the signal line driver circuit 108.

Note that among drive signals generated in the panel controller 103, a start signal SP input to the scan line driver circuit 109 is a start signal GSP, and a start signal SP input to the signal line driver circuit 108 is a start signal SSP. In addition, among the drive signals generated in the panel controller 103, a clock signal CK input to the scan line driver circuit 109 is a clock signal GCK, and a clock signal CK input to the signal line driver circuit 108 is a clock signal SCK. Further, among power supply voltages generated in the panel controller 103, a power supply voltage Vp input to the scan line driver circuit 109 is a power supply voltage GVp, and a power supply voltage Vp input to the signal line driver circuit 108 is a power supply voltage SVp.

Note that the start signal GSP is a pulse signal based on vertical synchronous frequency, and the start signal SSP is a pulse signal based on a selection period of one scan line GL.

Further, the clock signal GCK is not limited to one clock signal, and a plurality of clock signals having different phases may be used as the clock signal GCK. When a plurality of clock signals are used as the clock signal GCK, the operation speed of the scan line driver circuit 109 can be improved. Further, the clock signal SCK is not limited to one clock signal, and a plurality of clock signals having different phases may be used as the clock signal SCK. When a plurality of clock signals having different phases are used as the clock signal SCK, the operation speed of the signal line driver circuit 108 can be improved. Note that a common clock signal CK may be used as the clock signal GCK and the clock signal SCK.

In a frame period during which the CPU 101, the panel controller 103, the image memory 104, and the driver circuit 107 continuously operate (hereinafter this frame period is referred to as a first frame period), when the clock signal CK and the power supply voltage Vp are input, the panel controller 103 starts to supply the power supply voltage GVp, the start signal GSP, and the clock signal GCK to the scan line driver circuit 109. Specifically, first, the panel controller 103 starts to supply the power supply potential GVp. When the supply of the power supply voltage GVp is stabilized, the panel controller 103 starts to supply the clock signal GCK. Then, the panel controller 103 starts to supply the start signal GSP. Note that the potential of a wiring to which the clock signal GCK is input is preferably stabilized by application of a high potential of the clock signal GCK to the wiring just before the panel controller 103 starts to supply the clock signal GCK. By this method, the scan line driver circuit 109 can be prevented from malfunctioning at the time of starting operation.

In the first frame period, when the clock signal CK and the power supply voltage Vp are input, the panel controller 103 starts to supply the power supply voltage SVp, the start signal SSP, and the clock signal SCK to the signal line driver circuit 108. Specifically, first, the panel controller 103 starts to supply the power supply potential SVp. When the supply of the power supply voltage SVp is stabilized, the panel controller 103 starts to supply the clock signal SCK. Then, the panel controller 103 starts to supply the start signal SSP. Note that the potential of a wiring to which the clock signal SCK is input is preferably stabilized by application of a high potential of the clock signal SCK to the wiring just before the panel controller 103 starts to supply the clock signal SCK. By this method, the signal line driver circuit 108 can be prevented from malfunctioning at the time of starting operation.

When the scan line driver circuit 109 starts operation, a scan signal SCN having a pulse is input from the scan line driver circuit 109 to the scan line GL, so that the pixels 130 in the pixel portion 106 are sequentially selected. Then, when the signal line driver circuit 108 starts operation, an image signal is input from the signal line driver circuit 108 to the selected pixel 130 through the signal line SL. In the pixel 130 to which the image signal is input, the display element (e.g., the liquid crystal element 132) expresses gradation in response to the image signal.

Next, in a frame period during which the CPU 101, the panel controller 103, the image memory 104, and the driver circuit 107 stop (hereinafter this frame period is referred to as a second frame period), the panel controller 103 stops supplying the power supply voltage GVp and the clock signal GCK. Specifically, first, the panel controller 103 stops supplying the clock signal GCK, stops supplying the scan signal SCN in the scan line driver circuit 109, and ends the selection operation of all the scan lines GL. After that, the panel controller 103 stops supplying the power supply potential GVp. Note that to stop supplying means, for example, to set a wiring to which a signal or voltage is input in a floating state, or to apply a low potential to a wiring to which a signal or voltage is input. By this method, the scan line driver circuit 109 can be prevented from malfunctioning at the time of stopping the operation.

In the second frame period, the panel controller 103 stops supplying the power supply voltage SVp and the clock signal SCK. Specifically, first, the panel controller 103 stops supplying the clock signal SCK, stops supplying the image signal in the signal line driver circuit 108, and ends the input operation of all the signal lines SL. After that, the panel controller 103 stops supplying the power supply potential SVp. By this method, the signal line driver circuit 108 can be prevented from malfunctioning at the time of stopping the operation.

In the second frame period, the display element included in the pixel 130 continuously expresses predetermined gradation in accordance with image data in the image signal written in the first frame period. For example, in the case where the liquid crystal element 132 is used as a display element, the pixel electrode of the liquid crystal element 132 is set in a floating state; thus, the liquid crystal element 132 holds transmittance set in accordance with the data in the image signal written in the first frame period. Thus, in the second frame period, the pixel portion 106 holds an image based on the data in the image signal written in the first frame period as a still image for a certain period.

Next, in the first frame period, the panel controller 103 starts to supply the drive signals and the power supply voltages to the driver circuit 107, so that the signal line driver circuit 108 and the scan line driver circuit 109 start operation.

As described in the above example, in the semiconductor display device 100 according to one aspect of this embodiment, in the second driving method, the supply of drive signals and power supply voltages to the driver circuit 107 can be stopped, and an image can be continuously displayed on the pixel portion 106 for a certain period. With the above structure, the semiconductor display device 100 according to one aspect of this embodiment can consume less power.

Note that in this embodiment, input of a variety of drive signals to the panel controller 103 is controlled by the power supply controller 102. However, in one embodiment of the present invention, the input of some or all of the variety of drive signals to the panel controller 103 may be controlled by the CPU 101.

Figure 8:
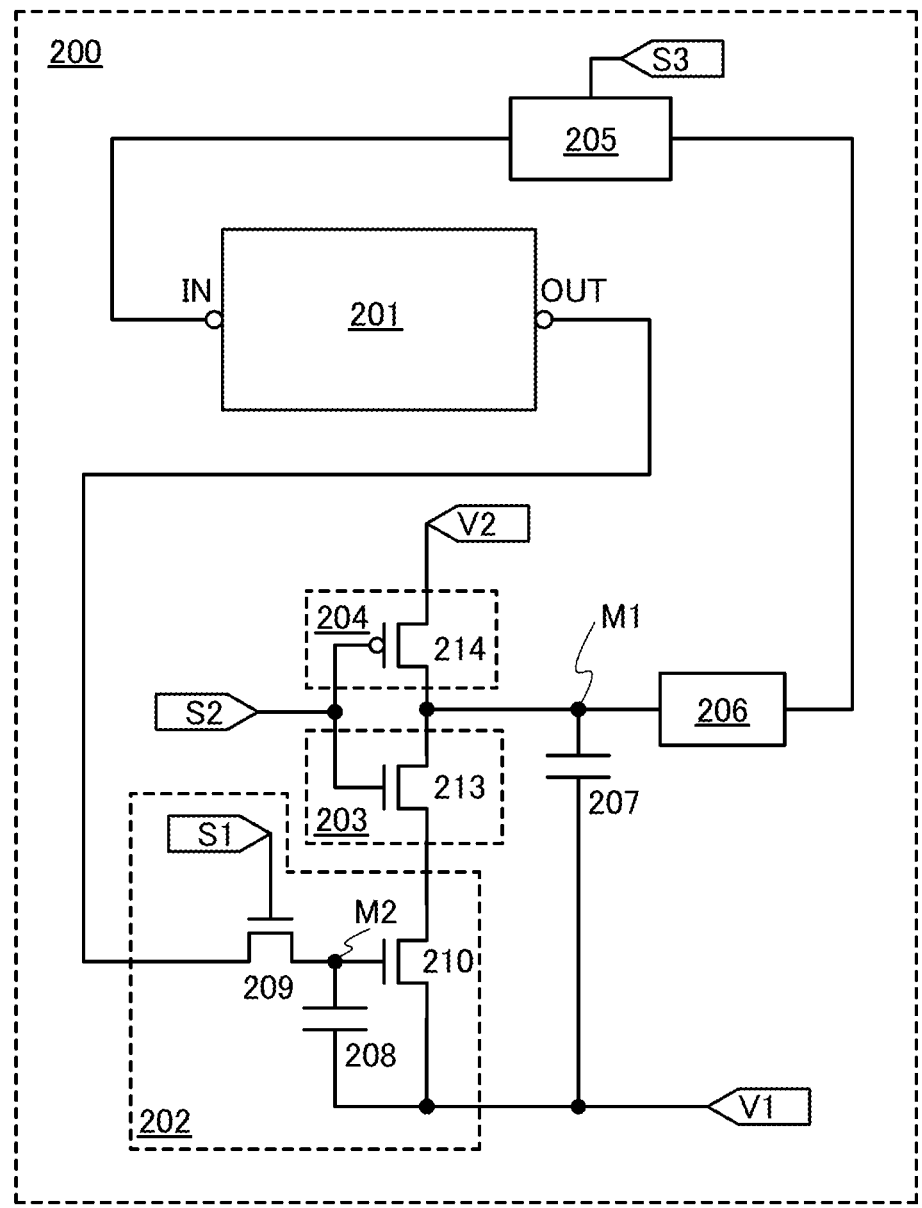
FIG. 8 is a circuit diagram of a memory element.

Next, the structure of the storage device 110 included in the CPU 101 in one embodiment of the present invention is described. In one embodiment of the present invention, the storage device 110 includes a plurality of memory elements. FIG. 8 is an example of a circuit diagram of a memory element 200.

The memory element 200 includes a first memory circuit 201, a second memory circuit 202, a switch 203, a switch 204, a switch 205, a logic element 206, and a capacitor 207. The first memory circuit 201 retains data only in a period during which power supply voltage is supplied. The second memory circuit 202 includes a capacitor 208 and a transistor 210 that correspond to a storage, and a transistor 209 for controlling supply, holding, and release of an electric charge in the storage.

Note that the memory element 200 may further include another circuit element such as a diode, a resistor, or an inductor as needed.

The transistor 209 includes an oxide semiconductor in a channel formation region.

FIG. 8 illustrates an example in which the switch 203 is a transistor 213 having conductivity (e.g., an n-channel transistor) and the switch 204 is a transistor 214 having another conductivity (e.g., a p-channel transistor).

A first terminal of the switch 203 corresponds to one of a source terminal and a drain terminal of the transistor 213. A second terminal of the switch 203 corresponds to the other of the source terminal and the drain terminal of the transistor 213. Conduction or non-conduction between the first terminal and the second terminal of the switch 203 (i.e., an on state or an off state of the transistor 213) is selected by a control signal S2 input to a gate electrode of the transistor 213.

A first terminal of the switch 204 corresponds to one of a source terminal and a drain terminal of the transistor 214. A second terminal of the switch 204 corresponds to the other of the source terminal and the drain terminal of the transistor 214. Conduction or non-conduction between the first terminal and the second terminal of the switch 204 (i.e., an on state or an off state of the transistor 214) is selected by the control signal S2 input to a gate electrode of the transistor 214.

One of a source terminal and a drain terminal of the transistor 209 is electrically connected to one of a pair of electrodes of the capacitor 208 and a gate electrode of the transistor 210. The gate electrode of the transistor 210 is referred to as a node M2.

One of a source terminal and a drain terminal of the transistor 210 is connected to a wiring to which a potential V1 is applied. The other of the source terminal and the drain terminal of the transistor 210 is connected to the first terminal of the switch 203. The second terminal of the switch 203 is connected to the first terminal of the switch 204. The second terminal of the switch 204 is connected to a wiring to which a potential V2 is applied. The second terminal of the switch 203, the first terminal of the switch 204, an input terminal of the logic element 206, and one of a pair of electrodes of the capacitor 207 are connected to each other. The second terminal of the switch 203 and the first terminal of the switch 204 are referred to as a node M1.

Note that a constant potential can be applied to the other of the pair of electrodes of the capacitor 207. For example, a low power supply potential (e.g., a ground potential) or a high power supply potential can be applied to the other of the pair of electrodes of the capacitor 207. The other of the pair of electrodes of the capacitor 207 may be connected to the wiring to which the potential V1 is applied. A constant potential can be applied to the other of the pair of electrodes of the capacitor 208. For example, a low power supply potential (e.g., a ground potential) or a high power supply potential can be applied to the other of the pair of electrodes of the capacitor 208. The other of the pair of electrodes of the capacitor 208 may be connected to the wiring to which the potential V1 is applied. FIG. 8 illustrates an example in which the other of the pair of electrodes of the capacitor 207 and the other of the pair of electrodes of the capacitor 208 are connected to the wiring to which the potential V1 is applied.

It is possible not to provide the capacitor 207 by positively utilizing parasitic capacitance or the like. It is possible not to provide the capacitor 208 by positively utilizing gate capacitance of the transistor 210 or the like. Note that gate capacitance corresponds to capacitance formed between a gate electrode and an active layer.

A control signal S1 is input to a gate electrode of the transistor 209. In each of the switch 203 and the switch 204, conduction or non-conduction between the first terminal and the second terminal is selected by the control signal S2 that is different from the control signal S1. When the first terminal and the second terminal of one of the switches are in a conduction state, the first terminal and the second terminal of the other of the switches are in a non-conduction state. In the switch 205, conduction or non-conduction between a first terminal and a second terminal is selected by a control signal S3 that is different from the control signal S1 and the control signal S2.

A signal corresponding to data retained in the first memory circuit 201 is input to the other of the source terminal and the drain terminal of the transistor 209. FIG. 8 illustrates an example in which a signal output from an output terminal OUT of the first memory circuit 201 is input to the other of the source terminal and the drain terminal of the transistor 209. The polarity of a signal output from the second terminal of the switch 203 is inverted by the logic element 206, and the inversion signal is input to the first memory circuit 201 through the switch 205 in which the first terminal and the second terminal are set in a conduction state by the control signal S3.

Note that FIG. 8 illustrates an example in which a signal output from the second terminal of the switch 203 is input to an input terminal (denoted by IN in FIG. 8) of the first memory circuit 201 through the logic element 206 and the switch 205; however, one embodiment of the present invention is not limited this structure. A signal output from the second terminal of the switch 203 may be input to the first memory circuit 201 without its polarity being inverted. For example, in the case where the first memory circuit 201 has a node in which a signal obtained by inversion of the polarity of a signal input from the input terminal is held, a signal output from the second terminal of the switch 203 can be input to the node.

In FIG. 8, voltage corresponding to a difference between the potential V1 and the potential V2 is supplied to the memory element 200 as power supply voltage. The voltage corresponding to the difference between the potential V1 and the potential V2 may be supplied to the first memory circuit 201 as power supply voltage. In a period during which power supply voltage is not supplied to the first memory circuit 201, the potential V1 and the potential V2 are substantially equal.

Note that the switch 205 can be a transistor. The transistor may be an n-channel transistor or a p-channel transistor. Alternatively, an n-channel transistor and a p-channel transistor may be used in combination. For example, an analog switch can be used as the switch 205.

In FIG. 8, the transistor 209 can have two gate electrodes above and below a semiconductor film including an oxide semiconductor. The control signal S1 can be input to one of the gate electrodes, and a control signal S4 can be input to the other of the gate electrodes. The control signal S4 may be a signal having a constant potential. The constant potential may be the potential V1 or the potential V2. Note that the two gate electrodes provided above and below the semiconductor film may be connected to each other, and the control signal S1 may be input to the gate electrodes. The threshold voltage of the transistor 209 can be controlled by a signal input to the other of the gate electrodes of the transistor 209. The off-state current of the transistor 209 can be reduced by controlling the threshold voltage.

In FIG. 8, among the transistors used in the memory element 200, a transistor whose channel formation region includes a semiconductor other than an oxide semiconductor may be used as any of the transistors except the transistor 209. For example, any of the transistors except the transistor 209 may be a transistor whose channel formation region is formed in a semiconductor film including silicon or a silicon substrate.

The first memory circuit 201 in FIG. 8 includes a first logic element and a second logic element. An input terminal of the first logic element is connected to an output terminal of the second logic element. An input terminal of the second logic element is connected to an output terminal of the first logic element. The first logic element and the second logic element each output a signal corresponding to a signal input only in a period during which power supply voltage is supplied.

For example, an inverter or a clocked inverter can be used as the logic element.

Next, a method for driving the memory element 200 in FIG. 8 is described with reference to a timing chart in FIG. 9.

Figure 9:
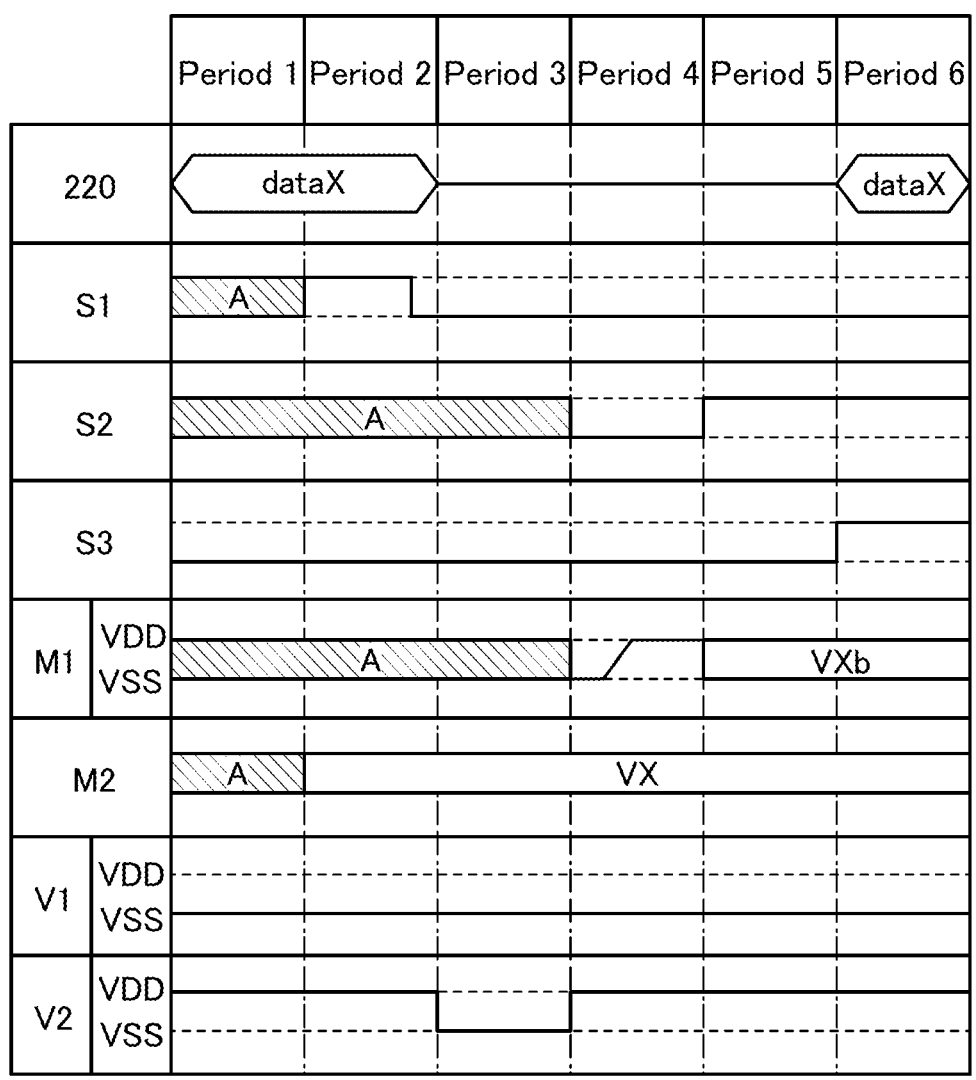
FIG. 9 is a timing chart illustrating the operation of a memory element.

In the timing chart in FIG. 9, reference numeral 220 denotes data retained in the first memory circuit 201; reference symbol S1 denotes the potential of the control signal S1; reference symbol S2 denotes the potential of the control signal S2; reference symbol S3 denotes the potential of the control signal S3; reference symbol V1 denotes the potential V1; and reference symbol V2 denotes the potential V2. When power supply voltage is not supplied to the memory element 200, a difference V between the potential V1 and the potential V2 is approximately 0. Reference symbol M1 denotes the potential of the node M1, and reference symbol M2 denotes the potential of the node M2.

Note that in the driving method described below, in the structure illustrated in FIG. 8, an n-channel transistor is used as the switch 203 and a p-channel transistor is used as the switch 204. The first terminal and the second terminal of the switch 203 are brought into conduction and the first terminal and the second terminal of the switch 204 are brought out of conduction when the potential of the control signal S2 is a high potential. The first terminal and the second terminal of the switch 203 are brought out of conduction and the first terminal and the second terminal of the switch 204 are brought into conduction when the potential of the control signal S2 is a low potential. Further, the first terminal and the second terminal of the switch 205 are brought into conduction when the potential of the control signal S3 is a high potential, and the first terminal and the second terminal of the switch 205 are brought out of conduction when the potential of the control signal S3 is a low potential. Furthermore, an n-channel transistor is used as the transistor 209, the transistor 209 is turned on when the potential of the control signal S1 is a high potential, and the transistor 209 is turned off when the potential of the control signal S1 is a low potential.

However, a driving method of the present invention is not limited thereto, and as described below, the potential of each control signal can be determined so that the switch 203, the switch 204, the switch 205, and the transistor 209 are in the same state.

The potential V1 is a low power supply potential VSS and the potential V2 switches between a high power supply potential VDD and the power supply potential VSS. The power supply potential VSS may be, for example, a ground potential. Note that one embodiment of the present invention is not limited this structure, and the potential V2 may be the power supply potential VSS and the potential V1 may switch between the power supply potential VDD and the power supply potential VSS.

(Normal Operation)

Operation in a period 1 in FIG. 9 is described. In the period 1, power supply voltage is supplied to the memory element 200. In the period 1, the potential V2 is the power supply potential VDD. In a period during which power supply voltage is supplied to the memory element 200, data (indicated by data X in FIG. 9) is retained in the first memory circuit 201. At this time, the potential of the control signal S3 is set to a low potential so that the first terminal and the second terminal of the switch 205 are brought out of conduction. Note that the first terminal and the second terminal of each of the switch 203 and the switch 204 may be in a conduction state or a non-conduction state. In other words, the potential of the control signal S2 may be a high potential or a low potential (the potential is indicated by A in FIG. 9). Further, the transistor 209 may be on or off. In other words, the potential of the control signal S1 may be a high potential or a low potential (the potential is indicated by A in FIG. 9). In the period 1, the potential of the node M1 may be a high potential or a low potential (the potential is indicated by A in FIG. 9). In the period 1, the potential of the node M2 may be a high potential or a low potential (the potential is indicated by A in FIG. 9). The operation in the period 1 is referred to as normal operation.

(Operation Before Stop of Supply of Power Supply Voltage)

Operation in a period 2 in FIG. 9 is described. Before the supply of power supply voltage to the memory element 200 is stopped, the potential of the control signal S1 is set to a high potential so that the transistor 209 is turned on. Thus, a signal corresponding to the data (the data X) retained in the first memory circuit 201 is input to the gate electrode of the transistor 210 through the transistor 209. The signal input to the gate electrode of the transistor 210 is held in the capacitor 208 or the gate capacitance of the transistor 210. Accordingly, the potential of the node M2 becomes a signal potential corresponding to the data retained in the first memory circuit 201 (the potential is indicated by VX in FIG. 9). After that, the potential of the control signal S1 is set to a low potential so that the transistor 209 is turned off. Thus, the signal corresponding to the data retained in the first memory circuit 201 is held in the second memory circuit 202. Also in the period 2, the first terminal and the second terminal of the switch 205 are brought out of conduction by the control signal S3. The first terminal and the second terminal of each of the switch 203 and the switch 204 may be in a conduction state or a non-conduction state. In other words, the potential of the control signal S2 may be a high potential or a low potential (the potential is indicated by A in FIG. 9). In the period 2, the potential of the node M1 may be a high potential or a low potential (the potential is indicated by A in FIG. 9). The operation in the period 2 is referred to as operation before the stop of supply of power supply voltage.

Operation in a period 3 in FIG. 9 is described. After the operation before the stop of supply of power supply voltage is performed, the potential V2 is set to the power supply potential VSS at the beginning of the period 3, and the supply of power supply voltage to the memory element 200 is stopped. When the supply of power supply voltage is stopped, the data retained in the first memory circuit 201 (the data X) is lost. However, even after the supply of power supply voltage to the memory element 200 is stopped, the signal potential VX corresponding to the data retained in the first memory circuit 201 (the data X) is held in the node M2 by the capacitor 208 or the gate capacitance of the transistor 210. Since the transistor 209 has extremely low off-state current, the potential held in the capacitor 208 or the gate capacitance of the transistor 210 (the potential VX of the node M2) can be held for a long time. Thus, even after the supply of power supply voltage to the memory element 200 is stopped, the data (the data X) is retained. The period 3 corresponds to a period during which the supply of power supply voltage to the memory element 200 is stopped.

(Restart of Supply of Power Supply Voltage)

Operation in a period 4 in FIG. 9 is described. After the supply of power supply voltage to the memory element 200 is restarted by setting the potential V2 to the power supply potential VDD, the potential of the control signal S2 is set to a low potential so that the first terminal and the second terminal of the switch 204 are brought into conduction and the first terminal and the second terminal of the switch 203 are brought out of conduction. At this time, the potential of the control signal S1 is a low potential, and the transistor 209 is kept off. The potential of the control signal S3 is a low potential, and the first terminal and the second terminal of the switch 205 are in a non-conduction state. Thus, the power supply potential VDD that is a constant potential can be applied to the second terminal of the switch 203 and the first terminal of the switch 204 (the node M1) (hereinafter, this operation is referred to as precharge operation). The potential of the node M1 is held in the capacitor 207.

After the precharge operation, in a period 5, the potential of the control signal S2 is set to a high potential so that the first terminal and the second terminal of the switch 203 are brought into conduction and the first terminal and the second terminal of the switch 204 are brought out of conduction. At this time, the potential of the control signal S1 remains the low potential, and the transistor 209 is kept off. The potential of the control signal S3 is a low potential, and the first terminal and the second terminal of the switch 205 are in a non-conduction state. Depending on a signal held in the capacitor 208 or the gate capacitance of the transistor 210 (the potential VX of the node M2), the on state or the off state of the transistor 210 is selected, so that the potential of the second terminal of the switch 203 and the first terminal of the switch 204, i.e., the potential of the node M1 is determined. Specifically, in the case where the transistor 210 is on, the potential V1 (e.g., the power supply potential VSS) is applied to the node M1. On the other hand, in the case where the transistor 210 is off, the potential of the node M1 remains the constant potential (e.g., the power supply potential VDD) that is determined by the precharge operation. In this manner, depending on the on state or the off state of the transistor 210, the potential of the node M1 becomes the power supply potential VDD or the power supply potential VSS.

For example, in the case where the signal held in the first memory circuit 201 corresponds to a digital value "1", the potential of a signal output from the output terminal OUT of the first memory circuit 201 is a high potential. In that case, the potential of the node M1 becomes the low power supply potential VSS corresponding to a signal of a digital value "0". On the other hand, in the case where the signal held in the first memory circuit 201 corresponds to a digital value "0", the potential of a signal output from the output terminal OUT of the first memory circuit 201 is a low potential. In that case, the potential of the node M1 becomes the high power supply potential VDD corresponding to a signal of a digital value "1". In other words, a potential corresponding to a digital value that is different from the digital value of the signal stored in the first memory circuit 201 is held in the node M1. This potential is indicated by VXb in FIG. 9. In other words, the potential of a signal corresponding to the data (data X) input from the first memory circuit 201 in the period 2 is converted into the potential VXb of the node M1.

After that, in a period 6, the potential of the control signal S3 is set to a high potential so that the first terminal and the second terminal of the switch 205 are brought into conduction. At this time, the potential of the control signal S2 remains the high potential. The potential of the control signal S1 remains the low potential, and the transistor 209 is kept off. Thus, a signal corresponding to the potential of the second terminal of the switch 203 and the first terminal of the switch 204 (the potential VXb of the node M1) is inverted by the logic element 206 to be an inversion signal corresponding to the data (the data X). The inversion signal is input to the first memory circuit 201. Thus, the data (the data X) that has been retained before the stop of the supply of power supply voltage to the memory element 200 can be retained in the first memory circuit 201 again.

In the memory element 200 in FIG. 8, after the potential of the node M1 is set to the constant potential (the power supply potential VDD in FIG. 9) by the precharge operation in the period 4, the potential of the node M1 is set to the potential VXb corresponding to the data (the data X) in the period 5; thus, it takes a shorter time to set the potential of the node M1 to the predetermined potential VXb. In other words, in the memory element 200 in FIG. 8, the switch 203 and the switch 204 enable precharge operation, so that it takes a shorter time to retain the original data in the first memory circuit 201 after the supply of power supply voltage is restarted.

In one embodiment of the present invention, in a period during which power supply voltage is not supplied to each memory element 200 included in the storage device, data stored in the first memory circuit 201 that corresponds to a volatile memory can be retained in the capacitor 208 or the gate capacitance of the transistor 210 provided in the second memory circuit 202.

The transistor 209 has extremely low off-state current because an oxide semiconductor is included in a channel formation region. Thus, by using the transistor 209, even when power supply voltage is not supplied to the memory element 200, an electric charge held in the capacitor 208 or the gate capacitance of the transistor 210 is held for a long time. Thus, the memory element 200 can retain data even in a period during which the supply of power supply voltage is stopped.

In the second memory circuit 202, the signal held in the capacitor 208 or the gate capacitance of the transistor 210 is converted into the state (the on state or the off state) of the transistor 210 after the supply of power supply voltage to the memory element 200 is restarted; thus, the signal can be read from the second memory circuit 202 by the drain current of the transistor 210. Consequently, the original signal can be accurately read even when a potential corresponding to the signal held in the capacitor 208 or the gate capacitance of the transistor 210 fluctuates to some degree.

When the memory element 200 is used in a storage device such as a register or a cache memory included in the CPU 101, data in the storage device can be prevented from being lost due to the stop of the supply of power supply voltage. Further, the state before the stop of the supply of power supply voltage can be backed up in a short time, and the storage device can return to the state before the stop of the supply of power supply voltage in a short time after the supply of power supply voltage is restarted. Thus, in the CPU 101, moreover, in the semiconductor display device 100, even when time from completion of writing of an image signal to the pixel portion 106 to the start of writing of another image signal is long, for example, 60 seconds, or short, for example, several milliseconds, the supply of power supply voltage can be stopped. Thus, the semiconductor display device 100 capable of consuming less power can be provided.

Note that in one embodiment of the present invention, each memory element 200 included in the CPU 101 includes a second memory circuit for storing data in the first memory circuit. The second memory circuit may include a storage for storing data by accumulation of an electric charge, and a transistor controlling supply, holding, and release of the electric charge in the storage and having extremely low off-state current. The memory element 200 with the structure in FIG. 8 corresponds to one embodiment of the present invention, and each memory element of the storage device included in the CPU 101 may have a structure that is different from the structure in FIG. 8.

Next, an example of a structure of the memory element 200 according to one embodiment of the present invention that is different from the structure in FIG. 8 is described with reference to FIG. 16.

Figure 16:
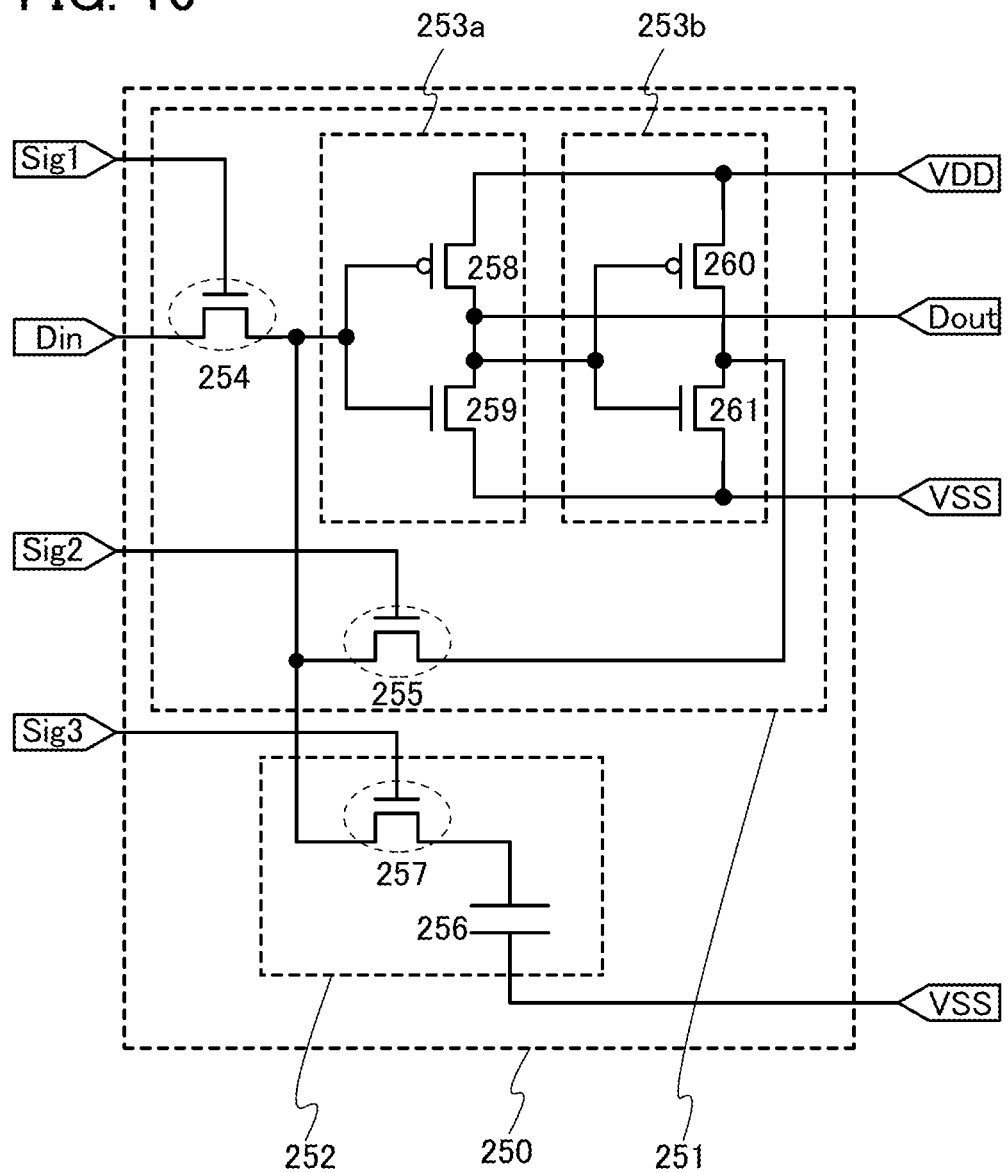
FIG. 16 is a circuit diagram of a memory element.

A memory element 250 in FIG. 16 includes a first memory circuit 251 and a second memory circuit 252. The first memory circuit 251 includes a first logic element 253*a* and a second logic element 253*b* that invert the polarity of a signal input and output the inversion signal, a transistor 254, and a transistor 255. The second memory circuit 252 includes a transistor 257 and a capacitor 256 corresponding to a storage.

A signal Din including data input to the memory element 250 is supplied to an input terminal of the first logic element 253*a* through the transistor 254. An output terminal of the first logic element 253*a* is connected to an input terminal of the second logic element 253*b*. An output terminal of the second logic element 253*b* is connected to the input terminal of the first logic element 253*a* through the transistor 255. The potential of the output terminal of the first logic element 253*a* or the input terminal of the second logic element 253*b* is output to the next memory element 250 or another circuit as a signal Dout.

Note that in FIG. 16, inverters are used as the first logic element 253*a* and the second logic element 253*b*; however, instead of the inverter, a clocked inverter can be used as the first logic element 253*a* or the second logic element 253*b*.

The capacitor 256 is connected to an input terminal of the memory element 250, i.e., a node to which the potential of the signal Din is applied, through the transistor 254 and the transistor 257 so that the data of the signal Din that is input to the memory element 250 can be stored as needed. Specifically, one of a pair of electrodes of the capacitor 256 is connected to the input terminal of the first logic element 253*a* through the transistor 257. The other of the pair of electrodes of the capacitor 256 is connected to a node to which the low power supply potential VSS (e.g., a ground potential) is applied.

The transistor 257 has much lower off-state current than a transistor including a normal semiconductor such as silicon or germanium because the transistor 257 includes an oxide semiconductor in a channel formation region. The length of a data retention period of the capacitor 256 depends on the amount of leakage of electric charge accumulated in the capacitor 256 through the transistor 257. Accordingly, when the electric charge accumulated in the capacitor 256 is held by the transistor 257 having extremely low off-state current, leakage of the electric charge from the capacitor 256 can be prevented, so that the data retention period can be made longer.

Note that although FIG. 16 illustrates the case where the transistor 257 has a single-gate structure, the transistor 257 may have a multi-gate structure in which a plurality of electrically connected gate electrodes are included so that a plurality of channel formation regions are included.

Although FIG. 16 illustrates the case where one transistor is the transistor 257, the present invention is not limited to this structure. In one embodiment of the present invention, a plurality of transistors may be the transistor 257. In the case where a plurality of transistors which function as switching elements are the transistor 257, the plurality of transistors may be connected to each other in parallel, in series, or in combination of parallel connection and series connection.

The memory element 250 may further include another circuit element such as a diode, a resistor, or an inductor as needed.

The first logic element 253*a* has a structure in which a p-channel transistor 258 and an n-channel transistor 259 whose gate electrodes are connected to each other are connected in series between a first node to which the high power supply potential VDD is applied and a second node to which the low power supply potential VSS is applied. Specifically, a source terminal of the p-channel transistor 258 is connected to the first node to which the power supply potential VDD is applied, and a source terminal of the n-channel transistor 259 is connected to the second node to which the power supply potential VSS is applied. In addition, a drain terminal of the p-channel transistor 258 is connected to a drain terminal of the n-channel transistor 259, and the potentials of the two drain terminals can be regarded as the potential of the output terminal of the first logic element 253*a*. Further, the potentials of the gate electrode of the p-channel transistor 258 and the gate electrode of the n-channel transistor 259 can be regarded as the potential of the input terminal of the first logic element 253*a*.

The second logic element 253*b* has a structure in which a p-channel transistor 260 and an n-channel transistor 261 whose gate electrodes are connected to each other are connected in series between the first node to which the high power supply potential VDD is applied and the second node to which the low power supply potential VSS is applied. Specifically, a source terminal of the p-channel transistor 260 is connected to the first node to which the power supply potential VDD is applied, and a source terminal of the n-channel transistor 261 is connected to the second node to which the power supply potential VSS is applied. In addition, a drain terminal of the p-channel transistor 260 is connected to a drain terminal of the n-channel transistor 261, and the potentials of the two drain terminals can be regarded as the potential of the output terminal of the second logic element 253*b*. Further, the potentials of the gate electrode of the p-channel transistor 260 and the gate electrode of the n-channel transistor 261 can be regarded as the potential of the input terminal of the second logic element 253*b*.

An on state or an off state of the transistor 254 is selected by a signal Sig1 supplied to a gate electrode of the transistor 254. An on state or an off state of the transistor 255 is selected by a signal Sig2 supplied to a gate electrode of the transistor 255. An on state or an off state of the transistor 257 is selected by a control signal Sig3 supplied to a gate electrode of the transistor 257.

Note that the first logic element 253*a* and the second logic element 253*b* need to operate at high speed. Thus, a transistor including crystalline silicon or germanium in a channel formation region is preferably used as the n-channel transistor 259 or the p-channel transistor 259 included in the first logic element 253*a* or the n-channel transistor 261 or the p-channel transistor 260 included in the second logic element 253*b*.

Note that the transistor 254 or the transistor 255 may include crystalline silicon or germanium in a channel formation region.

Next, an operation example of the memory element 250 in FIG. 16 is described.

First, at the time of writing data, the transistor 254 is turned on, and the transistor 255 and the transistor 257 are turned off. Then, the power supply potential VDD is applied to the first node and the power supply potential VSS is applied to the second node, so that the power supply voltage is applied to the first memory circuit 251. The potential of the signal Din supplied to the memory element 250 is applied to the input terminal of the first logic element 253a through the transistor 254, so that the potential of the output terminal of the first logic element 253a is a potential of the signal Din whose polarity is inverted. Then, the transistor 255 is turned on to connect the input terminal of the first logic element 253a to the output terminal of the second logic element 253b, so that data is written to the first logic element 253a and the second logic element 253b.

Next, in the case where the data input is retained in the first logic element 253a and the second logic element 253b, the transistor 255 is kept on, the transistor 257 is kept off, and the transistor 254 is turned off. By turning off the transistor 254, the data input is retained in the first logic element 253a and the second logic element 253b. At this time, the power supply potential VDD is applied to the first node and the power supply potential VSS is applied to the second node, so that the state in which the power supply voltage is applied between the first node and the second node is maintained.

The potential of the output terminal of the first logic element 253a reflects the data retained in the first logic element 253a and the second logic element 253b. Thus, by reading the potential, the data can be read from the memory element 250.

Note that in the case where the supply of power supply voltage is stopped at the time of retaining data, the data is retained in the capacitor 256 before the supply of power supply voltage is stopped. In the case where the data is retained in the capacitor 256, first, the transistor 254 is turned off and the transistor 255 and the transistor 257 are turned on. Then, through the transistor 257, an electric charge with an amount corresponding to the value of the data retained in the first logic element 253a and the second logic element 253b is accumulated in the capacitor 256, so that the data is written to the capacitor 256. After the data is stored in the capacitor 256, the transistor 257 is turned off, so that the data stored in the capacitor 256 is retained. After the transistor 257 is turned off, for example, the power supply potential VSS is applied to the first node and the second node so that the nodes have equal potentials, and the application of power supply voltage between the first node and the second node is stopped. Note that after the data is stored in the capacitor 256, the transistor 255 may be turned off.

In this manner, in the case where the data input is retained in the capacitor 256, the application of power supply voltage between the first node and the second node is not needed; thus, off-state current flowing between the first node and the second node through the p-channel transistor 258 and the n-channel transistor 259 included in the first logic element 253a or the p-channel transistor 260 and the n-channel transistor 261 included in the second logic element 253b can be as close to zero as possible. Consequently, power consumption due to the off-state current of the first memory circuit 251 at the time of retaining the data can be greatly reduced, and the storage device and the semiconductor display device including the storage device can consume less power.

As described above, the transistor 257 has extremely low off-state current. Thus, when the transistor 257 is off, the electric charge accumulated in the capacitor 256 does not easily leak, so that the data is retained.

In the case where the data stored in the capacitor 256 is read, the transistor 254 is turned off. Then, the power supply potential VDD is applied again to the first node and the power supply potential VSS is applied again to the second node, so that power supply voltage is applied between the first node and the second node. Then, by turning on the transistor 257, the signal Dout having a potential that reflects the data can be read from the memory element 250.

Figure 10A:
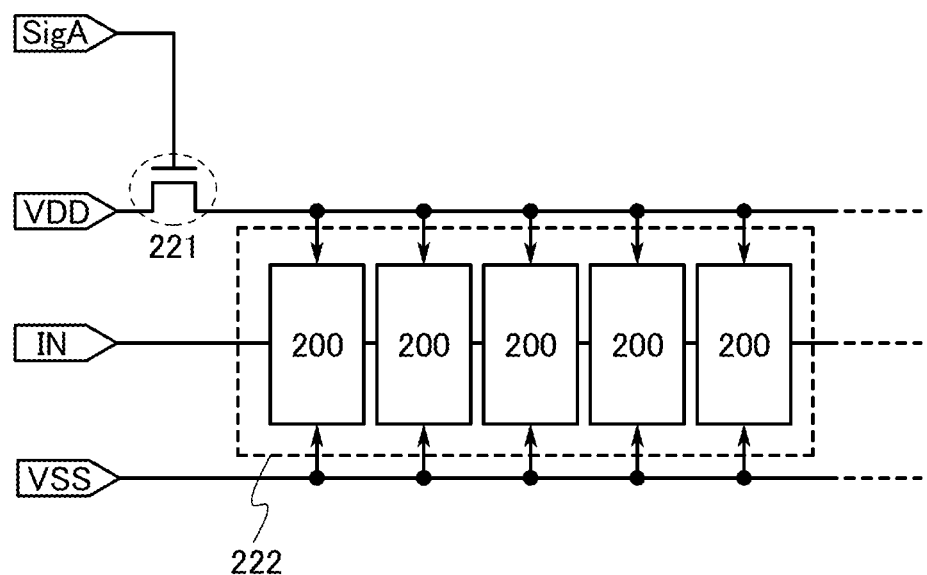
FIGS. 10A and 10B each illustrate the structure of a storage device.

Next, FIG. 10A illustrates a structure example of a storage device included in the CPU 101. The storage device in FIG. 10A includes a switching element 221 and a memory element group 222 including the plurality of memory elements 200. The high power supply potential VDD is applied to each memory element 200 included in the memory element group 222 through the switching element 221. Further, the potential of a signal IN and the low power supply potential VSS are applied to each memory element 200 included in the memory element group 222.

In FIG. 10A, a transistor is used as the switching element 221, and switching of the transistor is controlled by a control signal SigA supplied to a gate electrode of the transistor.

Although FIG. 10A illustrates the case where one transistor is the switching element 221, the present invention is not limited to this structure. In one embodiment of the present invention, a plurality of transistors may be the switching element 221. In the case where a plurality of transistors which function as switching elements are the switching element 221, the plurality of transistors may be connected to each other in parallel, in series, or in combination of parallel connection and series connection.

Figure 10B:
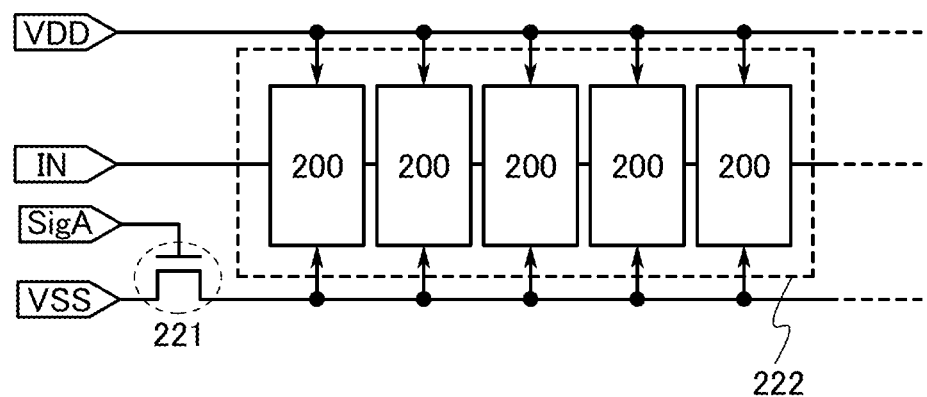

Although the switching element 221 controls the supply of the high power supply potential VDD to each memory element 200 included in the memory element group 222 in FIG. 10A, the switching element 221 may control the supply of the low power supply potential VSS. FIG. 10B illustrates an example of a storage device in which the low power supply potential VSS is applied to each memory element 200 included in the memory element group 222 through the switching element 221. The switching element 221 can control the supply of the low power supply potential VSS to each memory element 200 included in the memory element group 222.

This embodiment can be combined with any of the other embodiments as appropriate.

Embodiment 2

In this embodiment, an example of a shift register applicable to the scan line driver circuit 109 and the signal line driver circuit 108 of the semiconductor display device 100 described in the above embodiment is described.

Figure 11A:
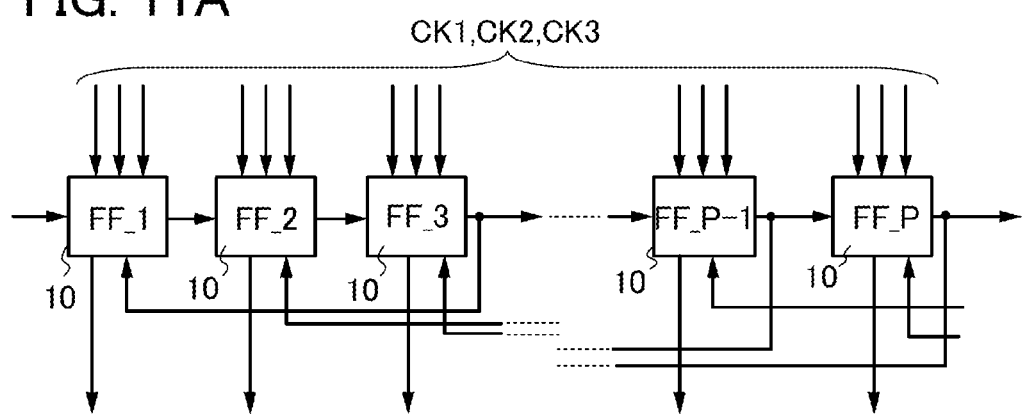
FIGS. 11A and 11B each illustrate the structure of a shift register.
Figure 11B:
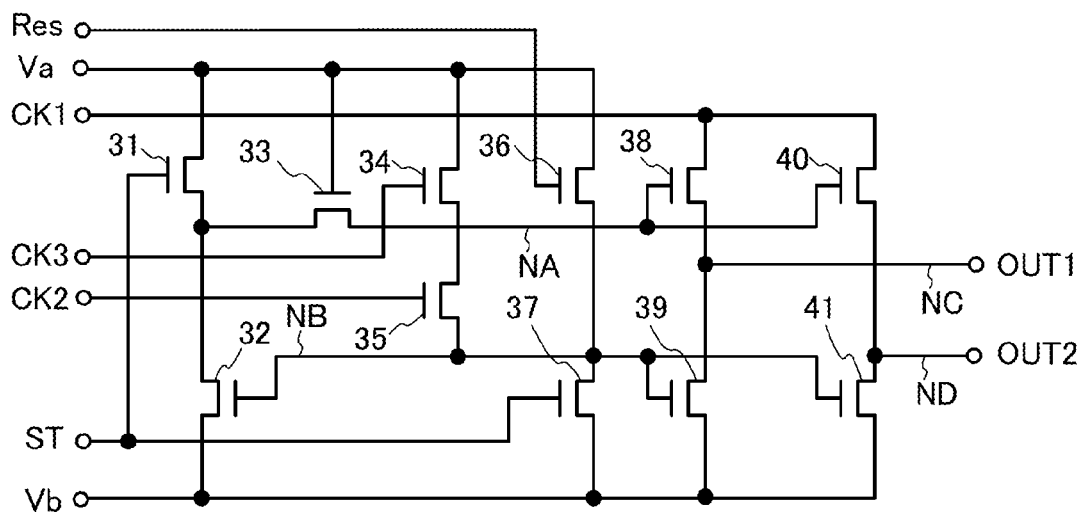

FIGS. 11A and 11B illustrate a structure example of the shift register in this embodiment.

The shift register in FIG. 11A is formed using P sequential logic units 10 (P is a natural number of 3 or more). In FIG. 11A, the P sequential logic units 10 are illustrated as sequential logic units FF_1 to FF_P.

A start signal ST and a reset signal Res are input to each of the sequential logic units FF_1 to FF_P.

Further, a clock signal CK1, a clock signal CK2, and a clock signal CK3 are input to each of the sequential logic units FF_1 to FF_P. As the clock signal CK1, the clock signal CK2, and the clock signal CK3, for example, any three of a first clock signal (also referred to as CLK1), a second clock signal (also referred to as CLK2), a third clock signal (also referred to as CLK3), and a fourth clock signal (also referred to as CLK4) can be used. The first to fourth clock signals are each a digital signal whose potential repeatedly switches between a high level and a low level. Note that different combinations of the clock signals are input to the adjacent sequential logic units 10. The shift register in FIG. 11A controls the operation of the sequential logic units 10 by the first to fourth clock signals. With the above structure, operation speed can be improved.

FIG. 11B illustrates an example of a specific circuit structure of the sequential logic unit 10 in FIG. 11A.

The sequential logic unit in FIG. 11B includes a transistor 31, a transistor 32, a transistor 33, a transistor 34, a transistor 35, a transistor 36, a transistor 37, a transistor 38, a transistor 39, a transistor 40, and a transistor 41. The case where all the transistors are n-channel transistors is given as an example, and a specific connection relation is described below.

Note that in this embodiment, the structure of the sequential logic unit is described referring to one of a source terminal and a drain terminal of the transistor as a first terminal and the other of the source terminal and the drain terminal of the transistor as a second terminal.

A power supply potential Va is input to a first terminal of the transistor 31, and the start signal ST is input to a gate electrode of the transistor 31. A power supply potential Vb is input to a first terminal of the transistor 32, and a second terminal of the transistor 32 is connected to a second terminal of the transistor 31.

Note that one of the power supply potential Va and the power supply potential Vb is a high potential Vdd, and the other is a low potential Vss. In the case where all the transistors are p-channel transistors, the values of the power supply potential Va and the power supply potential Vb interchange with each other. In addition, a difference between the power supply potential Va and the power supply potential Vb corresponds to power supply voltage.

A first terminal of the transistor 33 is connected to the second terminal of the transistor 31, and the power supply potential Va is input to a gate electrode of the transistor 33.

The power supply potential Va is input to a first terminal of the transistor 34, and the clock signal CK3 is input to a gate electrode of the transistor 34.

A first terminal of the transistor 35 is connected to a second terminal of the transistor 34. A second terminal of the transistor 35 is connected to a gate electrode of the transistor 32. The clock signal CK2 is input to a gate electrode of the transistor 35.

The power supply potential Va is input to a first terminal of the transistor 36, and the reset signal Res is input to a gate electrode of the transistor 36.

The power supply potential Vb is input to a first terminal of the transistor 37. A second terminal of the transistor 37 is connected to the gate electrode of the transistor 32 and a second terminal of the transistor 36. The start signal ST is input to a gate electrode of the transistor 37.

The clock signal CK1 is input to a first terminal of the transistor 38, and a gate electrode of the transistor 38 is connected to a second terminal of the transistor 33.

The power supply potential Vb is input to a first terminal of the transistor 39. A second terminal of the transistor 39 is connected to a second terminal of the transistor 38. A gate electrode of the transistor 39 is connected to the gate electrode of the transistor 32.

The clock signal CK1 is input to a first terminal of the transistor 40, and a gate electrode of the transistor 40 is connected to the second terminal of the transistor 33.

The power supply potential Vb is input to a first terminal of the transistor 41. A second terminal of the transistor 41 is connected to a second terminal of the transistor 40. A gate electrode of the transistor 41 is connected to the gate electrode of the transistor 32.

Note that in FIG. 11B, a point at which the second terminal of the transistor 33, the gate electrode of the transistor 38, and the gate electrode of the transistor 40 are connected to each other is referred to as a node NA. A point at which the gate electrode of the transistor 32, the second terminal of the transistor 35, the second terminal of the transistor 36, the second terminal of the transistor 37, the gate electrode of the transistor 39, and the gate electrode of the transistor 41 are connected to each other is referred to as a node NB. A point at which the second terminal of the transistor 38 and the second terminal of the transistor 39 are connected to each other is referred to as a node NC. A point at which the second terminal of the transistor 40 and the second terminal of the transistor 41 are connected to each other is referred to as a node ND.

The sequential logic unit in FIG. 11B outputs the potential of the node NC as a first output signal OUT1 and outputs the potential of the node ND as a second output signal OUT2. For example, the second output signal OUT2 can be used as the scan signal SCN for selecting the pixel 130 in the scan line driver circuit 109 and can be used as a signal for outputting an image signal to the selected pixel 130 in the signal line driver circuit 108.

Note that as the start signal ST input to the first sequential logic unit FF_1, for example, the start signal GSP, a start signal STP, or the like in the semiconductor display device 100 described in the above embodiment is used. Further, in each of the second to P-th sequential logic units FF_2 to FF_P, the first output signal OUT1 in the previous sequential logic unit is used as the start signal ST.

In each of the sequential logic units FF_1 to FF_P–2, the first output signal OUT1 in the sequential logic unit after the next sequential logic unit is used as the reset signal Res. In each of the sequential logic unit FF_P–1 and the sequential logic unit FF_P, a signal which is separately generated can be used as the reset signal Res, for example. Note that the (P–1)th sequential logic unit FF_P–1 and the P-th sequential logic unit FF_P are each used as a dummy sequential logic unit.

Next, an operation example of the shift register in FIG. 11A is described with reference to FIGS. 12A and 12B.

Figure 12A:
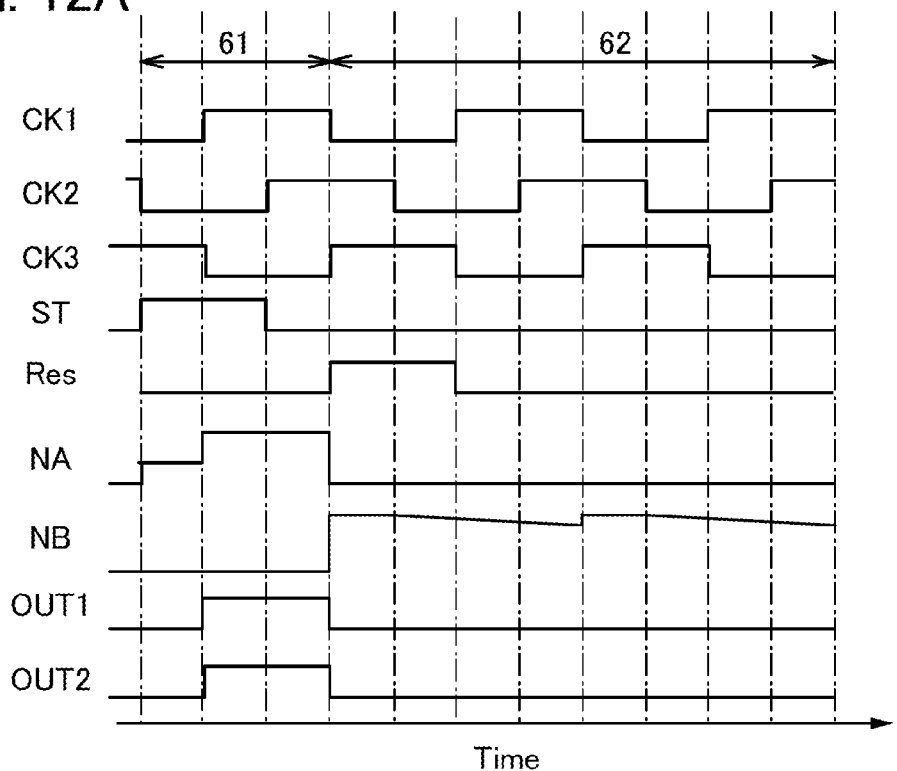
FIGS. 12A and 12B are timing charts each illustrating the operation of a shift register.
Figure 12B:
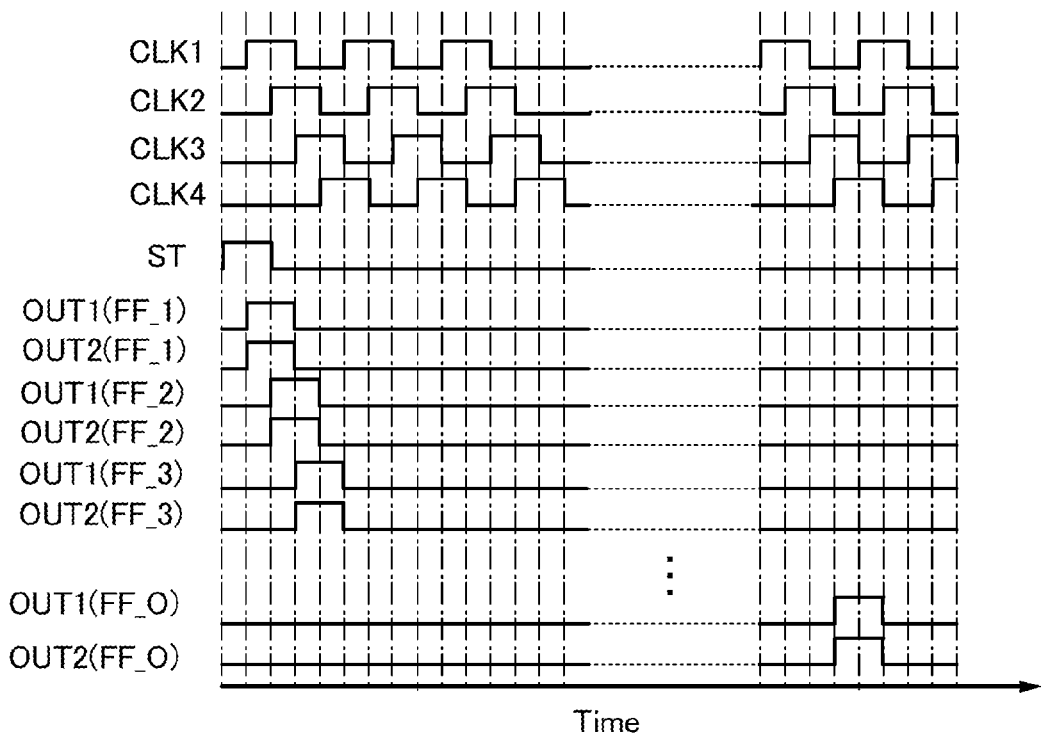

FIG. 12A is a timing chart illustrating an operation example of the sequential logic unit in FIG. 11B, and FIG. 12B is a timing chart illustrating an operation example of the shift register in FIG. 11A.

Note that FIG. 12A is a timing chart of the case where each of the sequential logic units 10 in FIG. 11A has the structure in FIG. 11B. The following description is made taking the case where the potential Vdd is input as the power supply potential Va and the potential Vss is input as the power supply potential Vb when all the transistors 31 to 41 in the sequential logic unit 10 in FIG. 11B are n-channel transistors, as an example.

As illustrated in FIG. 12A, by the input of the pulse of the start signal ST to each sequential logic unit 10 in a selection period 61, the transistor 31 is turned on. Then, the potential of the node NA becomes equal to or higher than the potential Vdd by bootstrap operation, so that the transistor 38 and the transistor 40 are turned on. In addition, when the transistor 37 is turned on by the input of the pulse of the start signal ST, the potential of the node NB becomes low, so that the transistor 39 and the transistor 41 are turned off. Accordingly, the potential of the first output signal OUT1 and the potential of the second output signal OUT2 become high.

Further, when the transistor 36 is turned on by the input of the pulse of the reset signal Res in a non-selection period 62, the potential of the node NB becomes high, so that the transistor 32, the transistor 39, and the transistor 41 are turned on. In addition, when the transistor 32 is turned on, the potential of the node NA becomes low, so that the transistor 38 and the transistor 40 are turned off. Accordingly, the potentials of the first output signal OUT1 and the second output signal OUT2 remain low.

The above operation is performed sequentially in the sequential logic units 10 in response to the first clock signal CLK1 to the fourth clock signal CLK4, so that the first output signal OUT1 and the second output signal OUT2 whose pulses are sequentially shifted can be output from each sequential logic unit 10, as illustrated in FIG. 12B.

In the case where the shift register described in this embodiment is applied to the scan line driver circuit 109 or the signal line driver circuit 108 included in the semiconductor display device 100 described in the above embodiment, the supply of the power supply voltage input to each sequential logic unit 10, the drive signal (e.g., the clock signal CLK), and the drive signal (e.g., the start signal SP) input to the first sequential logic unit is stopped, so that the operation of the scan line driver circuit 109 and the signal line driver circuit 108 can be stopped.

This embodiment can be combined with any of the other embodiments as appropriate.

Embodiment 3

Figure 13:
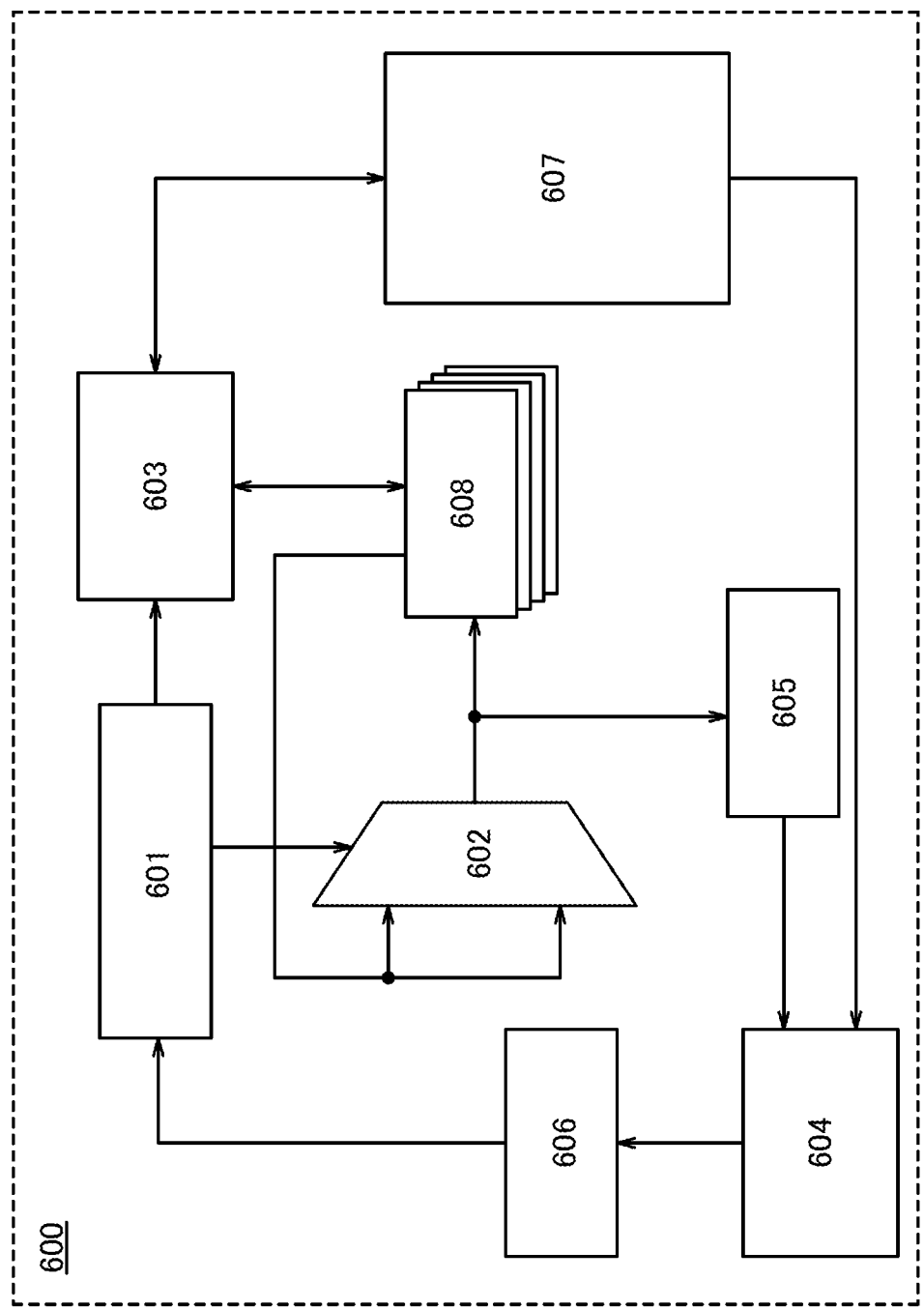
FIG. 13 is a block diagram illustrating the structure of a CPU.

In this embodiment, a specific embodiment of a CPU is described. FIG. 13 is a block diagram illustrating a structure example of a CPU.

A CPU 600 includes a controller 601, an arithmetic logic unit (ALU) 602 corresponding to an arithmetic unit, a data cache 603, an instruction cache 604, a program counter 605, an instruction register 606, a main storage device 607, and a register file 608.

The controller 601 has a function of decoding and executing an instruction input. The ALU 602 has a function of performing a variety of arithmetic processing such as four arithmetic operations and logic operations. The data cache 603 is a buffer storage device that temporarily stores frequently used data. The instruction cache 604 is a buffer storage device that temporarily stores a frequently used instruction of instructions (programs) sent to the controller 601. The program counter 605 is a register that stores an address of an instruction to be executed next. The instruction register 606 is a register that stores an instruction to be executed next. Data used for the arithmetic processing in the ALU 602 and an instruction that is executed in the controller 601 are stored in the main storage device 607. The register file 608 has a plurality of registers including a general-purpose register and can store data read from the main storage device 607, data which is obtained during the arithmetic processing in the ALU 602, data which is obtained as a result of the arithmetic processing in the ALU 602, and the like.

Next, the operation of the CPU 600 is described.

In response to an address of an instruction to be executed next that is stored in the program counter 605, the controller 601 reads the instruction from the corresponding address of the instruction cache 604, and stores the instruction in the instruction register 606. When the instruction is not stored in the corresponding address of the instruction cache 604, the controller 601 accesses a corresponding address of the main storage device 607, reads the instruction from the main storage device 607, and stores the instruction in the instruction register 606. In that case, the instruction is also stored in the instruction cache 604.

The controller 601 decodes the instruction stored in the instruction register 606 and executes the instruction. Specifically, the controller 601 generates a variety of signals for controlling the operation of the ALU 602 in response to the instruction.

When the instruction which is to be executed is an arithmetic instruction, the controller 601 makes the ALU 602 perform arithmetic processing using the data stored in the register file 608, and stores the arithmetic processing result in the register file 608.

When the instruction which is to be executed is a loading instruction, the controller 601, first, accesses a corresponding address of the data cache 603, and checks whether corresponding data exists in the data cache 603. When the corresponding data exists in the data cache 603, the data is copied from the corresponding address of the data cache 603 to the register file 608. When the corresponding data does not exist in the data cache 603, the data is copied from a corresponding address of the main storage device 607 to the corresponding address of the data cache 603, and then the data is copied from the corresponding address of the data cache 603 to the register file 608. Note that in the case where the corresponding data does not exist, since it is necessary to access the low-speed main storage device 607 as described above, it takes a longer time to execute the instruction as compared to the case where the controller 601 accesses only the buffer storage device (e.g., the data cache 603). However, when not only the data but also the address of the data and data of addresses of the vicinities of the data in the main storage device 607 are copied to the buffer storage device, second and subsequent accesses to the address of the data and the addresses of the vicinities of the data in the main storage device 607 can be performed at high speed.

When the instruction which is to be executed is a store instruction, the controller 601 stores data in the register file 608 in a corresponding address of the data cache 603. In that case, the controller 601, first, accesses the corresponding address of the data cache 603 and checks whether the corresponding data can be stored in the data cache 603. When the data can be stored in the data cache 603, the data is copied from the register file 608 to the corresponding address of the data cache 603. When the data cannot be stored, another corresponding address is assigned in part of the data cache 603, and the data is copied from the register file 608 to the corresponding address of the data cache 603. Note that the data can be copied to the main storage device 607 just after the data is copied to the data cache 603. Alternatively, after some pieces of data are copied to the data cache 603, the pieces of data can be collectively copied to the main storage device 607.

Then, after the controller 601 executes the instruction, the controller 601 accesses the program counter 605 again, and repeats the operation in which an instruction read from the instruction register 606 is decoded and executed.

In one embodiment of the present invention, when the storage device described in the above embodiment is applied to the buffer storage device (e.g., the data cache 603 or the instruction cache 604), data in the buffer storage device can be prevented from being lost due to the stop of the supply of power supply voltage. Further, the state before the stop of the supply of power supply voltage can be backed up in a short time, and the buffer storage device can return to the state before the stop of the supply of power supply voltage in a short time after the supply of power supply voltage is restarted. Thus, in the entire CPU 600 or the logic circuit (e.g., the controller 601 or the ALU 602) included in the CPU 600, even when time from completion of writing of an image signal to the pixel portion 106 to the start of writing of another image signal is long, for example, 60 seconds, or short, for example, several milliseconds, the supply of power supply voltage can be stopped. Thus, the CPU 600 can consume less power.

This embodiment can be combined with any of the other embodiments as appropriate.

Embodiment 4

In this embodiment, the structure of a pixel in a semiconductor display device according to one embodiment of the present invention is described taking the pixel 130 in FIG. 5B as an example.

Figure 14A:
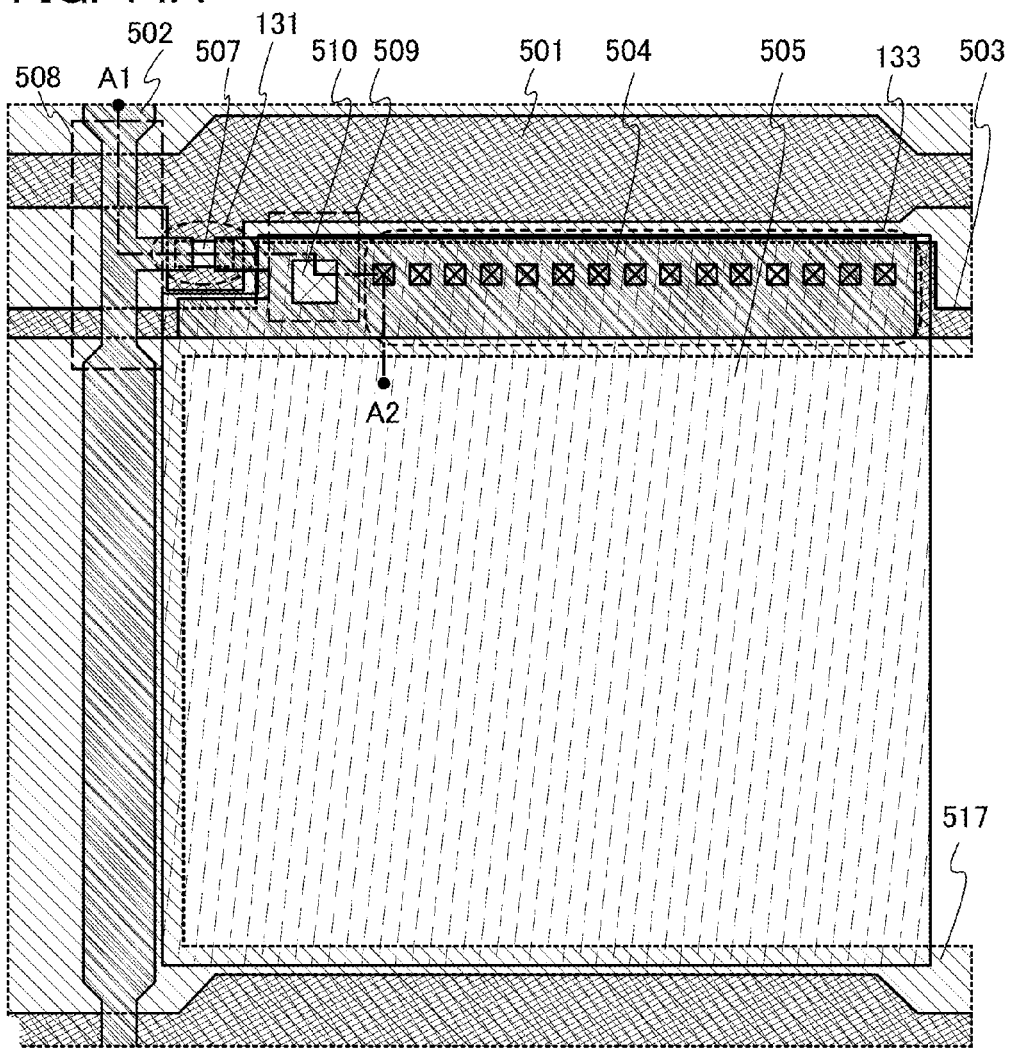
FIGS. 14A and 14B are a top view and a cross-sectional view of a pixel.
Figure 14B:
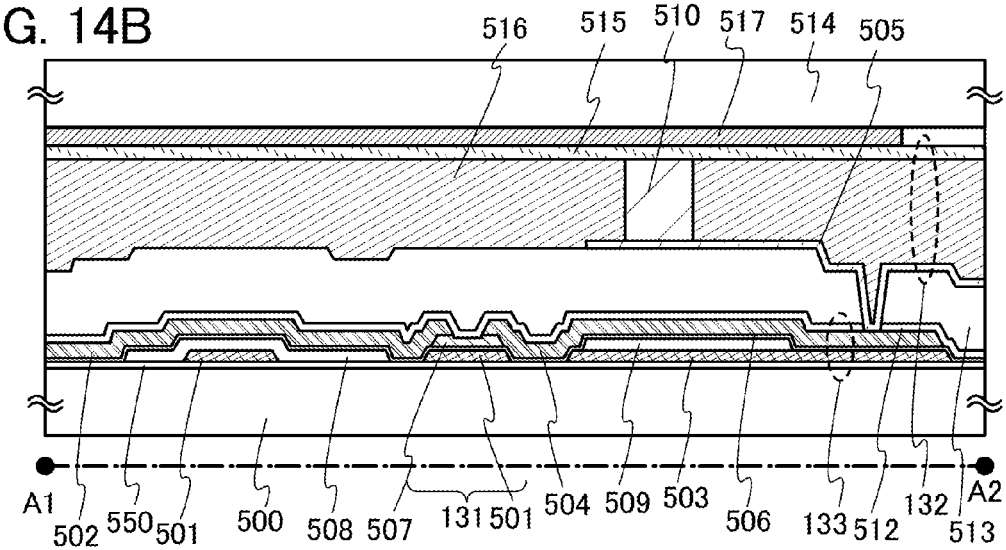

FIG. 14A is an example of a top view of a pixel. FIG. 14B is a cross-sectional view taken along dashed line A1-A2 in FIG. 14A.

The pixel in FIGS. 14A and 14B includes a conductive film 501 functioning as the scan line GL, a conductive film 502 functioning as the signal line SL, a conductive film 503 functioning as a wiring COM, and a conductive film 504 functioning as a second terminal of the transistor 131. The conductive film 501 also functions as the gate electrode of the transistor 131 in FIG. 5B. In addition, the conductive film 502 also functions as a first terminal of the transistor 131.

A base film 550 is formed over a substrate 500. As the base film 550, for example, a single layer of a silicon oxide film, a silicon oxynitride film, a silicon nitride film, a silicon nitride oxide film, an aluminum nitride film, or an aluminum oxide film or a stack of a plurality of these films can be used. In particular, when an insulating film having a high barrier property, for example, a silicon nitride film, a silicon nitride oxide film, an aluminum nitride film, an aluminum oxide film, or an aluminum nitride oxide film is used for the base film, impurities in an atmosphere, such as moisture or hydrogen or impurities included in the substrate 500, such as an alkali metal or a heavy metal, can be prevented from entering an active layer 507 or a gate insulating film 506 to be formed later, or an interface between the active layer 507 and another insulating film and the vicinity thereof. Note that in order to prevent hydrogen, which serves as an electron donor, from entering the active layer 507, the concentration of hydrogen in the base film 550 is preferably as low as possible. Specifically, the concentration of hydrogen in the base film 550 is preferably $7.2 \times 10^{20}$ cm$^{-3}$ or lower.

Note that in this specification, an oxynitride is a substance which includes more oxygen than nitrogen, and a nitride oxide is a substance which includes more nitrogen than oxygen.

The conductive film 501 and the conductive film 503 can be formed by processing one conductive film formed over the base film 550 into a desired shape. The gate insulating film 506 is formed over the conductive film 501 and the conductive film 503. Further, the conductive film 502 and the conductive film 504 can be formed by processing one conductive film formed over the gate insulating film 506 into a desired shape.

The active layer 507 of the transistor 131 is formed over the gate insulating film 506 to overlap with the conductive film 501. As illustrated in FIGS. 14A and 14B, the active layer 507 preferably completely overlaps with the conductive film 501 functioning as a gate electrode. With such a structure, an oxide semiconductor in the active layer 507 can be prevented from being degraded by incident light from the substrate 500 side; thus, degradation in characteristics of the transistor 131, such as a shift in threshold voltage of the transistor 131, can be prevented.

In the pixel in FIGS. 14A and 14B, an insulating film 512 and an insulating film 513 are sequentially formed to cover the active layer 507, the conductive film 502, and the conductive film 504. In addition, a pixel electrode 505 is formed over the insulating film 513, and the conductive film 504 is connected to the pixel electrode 505 through a contact hole formed in the insulating film 512 and the insulating film 513.

A portion where the conductive film 503 functioning as the wiring COM overlaps with the conductive film 504 with the gate insulating film 506 provided therebetween functions as the capacitor 133.

In this embodiment, an insulating film 508 is formed between the conductive film 501 and the gate insulating film 506. The insulating film 508 is provided between the conductive film 501 and the conductive film 502; thus, parasitic capacitance generated between the conductive film 501 and the conductive film 502 can be reduced by the insulating film 508.

In this embodiment, an insulating film 509 is formed between the conductive film 503 and the gate insulating film 506. In addition, a spacer 510 is formed over the pixel electrode 505 to overlap with the insulating film 509.

FIG. 14A is a top view of the pixel provided with the spacer 510. In FIG. 14B, a substrate 514 is provided to face the substrate 500 provided with the spacer 510.

A common electrode 515 is provided for the substrate 514, and a liquid crystal layer 516 containing a liquid crystal is provided between the pixel electrode 505 and the common electrode 515. The liquid crystal element 132 is formed in a portion where the pixel electrode 505, the common electrode 515, and the liquid crystal layer 516 overlap with each other.

In the case of a transmissive liquid crystal display device, the pixel electrode 505 and the common electrode 515 are each preferably formed using a light-transmitting conductive material. In the case of a reflective liquid crystal display device, it is preferable that the common electrode 515 be formed using a light-transmitting conductive material and that the pixel electrode 505 be formed using a light-reflecting conductive material.

Specifically, for the pixel electrode 505 and the common electrode 515, any of indium oxide, indium oxide-tin oxide (indium tin oxide (ITO)), indium oxide-tin oxide containing silicon or silicon oxide, indium oxide-zinc oxide (indium zinc oxide), indium oxide containing tungsten oxide and zinc oxide, an Al—Zn-based oxide semiconductor containing nitrogen, a Zn-based oxide semiconductor containing nitrogen, a Sn—Zn-based oxide semiconductor containing nitrogen, gold (Au), platinum (Pt), nickel (Ni), tungsten (W), chromium (Cr), molybdenum (Mo), iron (Fe), cobalt (Co), copper (Cu), palladium (Pd), and titanium (Ti) can be used. Other examples are elements that belong to Group 1 or 2 in the periodic table, for example, an alkali metal such as lithium (Li) or cesium (Cs) and an alkaline earth metal such as magnesium (Mg), calcium (Ca), or strontium (Sr), an alloy containing such an element (e.g., MgAg or AlLi), a rare earth metal such as europium (Eu) or ytterbium (Yb), and an alloy containing such an element. Note that each of the pixel electrode 505 and the common electrode 515 can be formed in such a manner that, for example, a conductive film is formed using the above material by sputtering, vapor deposition (including vacuum vapor deposition), or the like, and then the conductive film is processed into a desired shape by etching through a photolithography process.

An alignment film may be provided as appropriate between the pixel electrode 505 and the liquid crystal layer 516 or between the common electrode 515 and the liquid crystal layer 516. The alignment film can be formed using an organic resin such as polyimide or poly(vinyl alcohol). Alignment treatment for aligning liquid crystal molecules in a certain direction, such as rubbing, is performed on a surface of the alignment film. A roller wrapped with cloth of nylon or the like is rolled while being in contact with the alignment film so that the surface of the alignment film can be rubbed in a certain direction. Note that it is also possible to form the alignment film that has alignment characteristics with the use of an inorganic material such as silicon oxide by vapor deposition, without alignment treatment.

Injection of liquid crystals for formation of the liquid crystal layer 516 may be performed by a dispenser method (a dripping method) or a dipping method (a pumping method).

Note that the substrate 514 is provided with a light-blocking film 517 capable of blocking light so that disclination caused by disorder of alignment of the liquid crystal between pixels is prevented from being observed or dispersed light is prevented from entering a plurality of adjacent pixels. The light-blocking film 517 can be formed using an organic resin containing a black pigment such as a carbon black or low-valent titanium oxide. Alternatively, the light-blocking film 517 can be formed using a film including chromium.

When the light-blocking film 517 is provided to overlap with the active layer 507 of the transistor 131, the oxide semiconductor in the active layer 507 can be prevented from being degraded by incident light from the substrate 514 side; thus, degradation in characteristics of the transistor 131, such as a shift in threshold voltage of the transistor 131, can be prevented.

Although FIGS. 14A and 14B illustrate the liquid crystal element 132 in which the liquid crystal layer 516 is provided between the pixel electrode 505 and the common electrode 515, a liquid crystal display device according to one embodiment of the present invention is not limited to this structure. A pair of electrodes may be formed over one substrate as in an IPS liquid crystal element or a liquid crystal element exhibiting a blue phase.

Note that in the case where a driver circuit is formed on a panel, also by blocking a transistor used in the driver circuit from light with the use of a gate electrode or a light-blocking film, degradation in characteristics, such as a shift in threshold voltage of the transistor, can be prevented.

This embodiment can be combined with any of the other embodiments as appropriate.

Embodiment 5

A semiconductor display device according to one embodiment of the present invention can be used for display devices, personal computers, or image reproducing devices provided with recording media (typically, devices that reproduce the content of recording media such as digital versatile discs (DVDs) and have displays for displaying the reproduced images). Further, as electronic devices that can include the semiconductor display device according to one embodiment of the present invention, cellular phones, game machines (including portable game machines), personal digital assistants, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATMs), vending machines, and the like can be given. FIGS. 15A to 15E illustrate specific examples of these electronic devices.

Figure 15A:
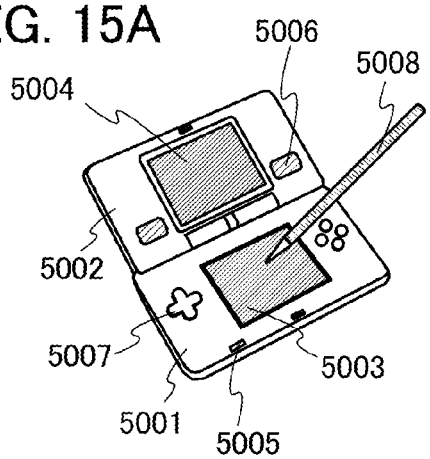
FIGS. 15A to 15E illustrate electronic devices.

FIG. 15A illustrates a portable game machine, which includes a housing 5001, a housing 5002, a display portion 5003, a display portion 5004, a microphone 5005, speakers 5006, an operation key 5007, a stylus 5008, and the like. It is possible to provide a low-power portable game machine with the use of the semiconductor display device according to one embodiment of the present invention as the display portion 5003 or 5004. Note that although the portable game machine illustrated in FIG. 15A has the two display portions 5003 and 5004, the number of display portions included in the portable game machine is not limited thereto.

Figure 15B:
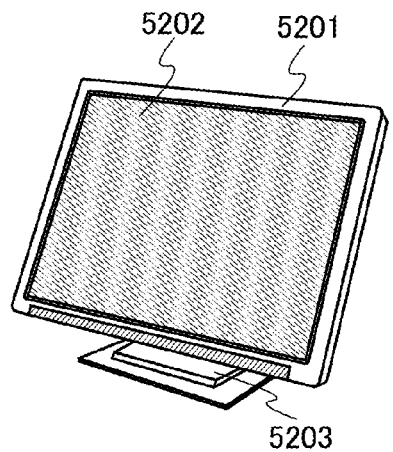

FIG. 15B illustrates a display device, which includes a housing 5201, a display portion 5202, a support 5203, and the like. It is possible to provide a low-power display device with the use of the semiconductor display device according to one embodiment of the present invention as the display portion 5202. Note that the display device means all display devices for displaying information, such as display devices for personal computers, for receiving TV broadcast, and for displaying advertisements.

Figure 15C:
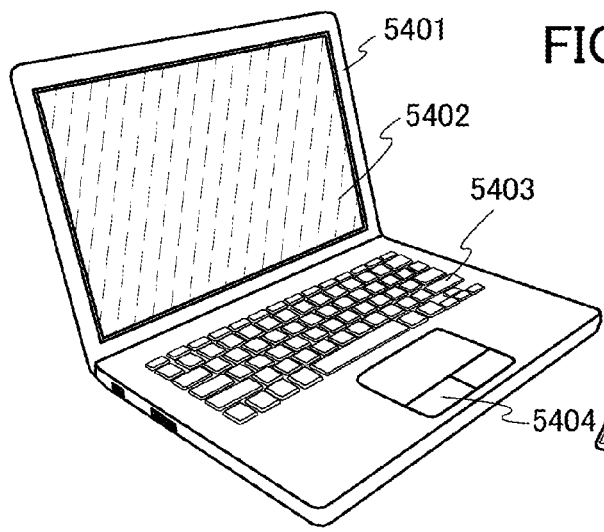

FIG. 15C illustrates a laptop, which includes a housing 5401, a display portion 5402, a keyboard 5403, a pointing device 5404, and the like. It is possible to provide a low-power laptop with the use of the semiconductor display device according to one embodiment of the present invention as the display portion 5402.

Figure 15D:
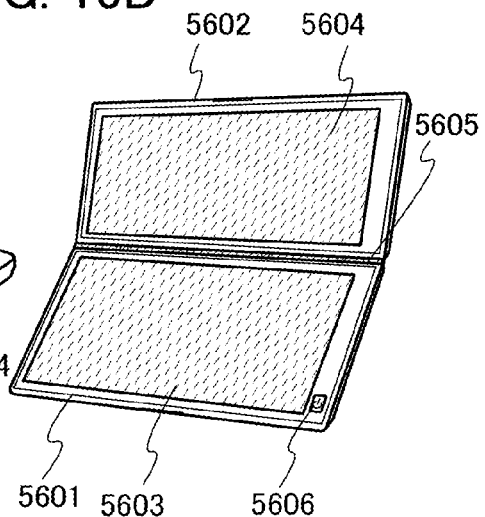

FIG. 15D illustrates a personal digital assistant, which includes a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and an angle between the first housing 5601 and the second housing 5602 can be changed with the joint 5605. An image on the first display portion 5603 may be switched depending on the angle between the first housing 5601 and the second housing 5602 at the joint 5605. A semiconductor display device with a position input function may be used as at least one of the first display portion 5603 and the second display portion 5604. Note that the position input function can be added by provision of a touch panel in a semiconductor display device. Alternatively, the position input function can be added by provision of a photoelectric conversion element called a photosensor in a pixel portion of a semiconductor display device. It is possible to provide a low-power personal digital assistant with the use of the semiconductor display device according to one embodiment of the present invention as the first display portion 5603 or the second display portion 5604.

Figure 15E:
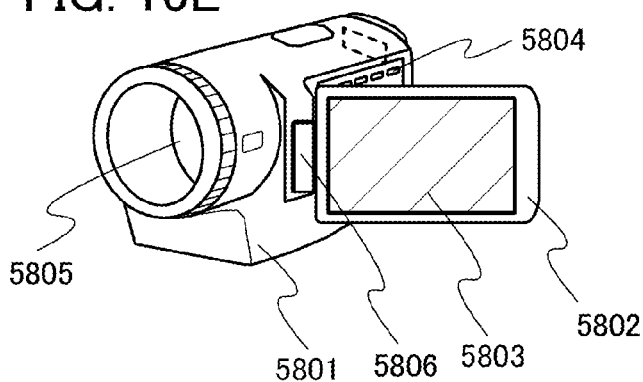

FIG. 15E illustrates a video camera, which includes a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 and the second housing 5802 are connected to each other with the joint 5806, and an angle between the first housing 5801 and the second housing 5802 can be changed with the joint 5806. An image on the display portion 5803 may be switched depending on the angle between the first housing 5801 and the second housing 5802 at the joint 5806. It is possible to provide a low-power video camera with the use of the semiconductor display device according to one embodiment of the present invention as the display portion 5803.

This embodiment can be combined with any of the other embodiments as appropriate.

Embodiment 6

Figure 7A:
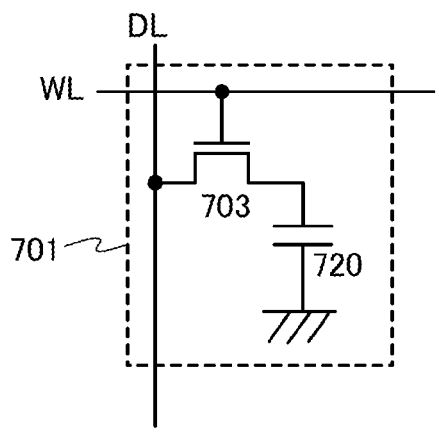
FIGS. 7A to 7C each illustrate the structure of a memory cell.
Figure 7B:
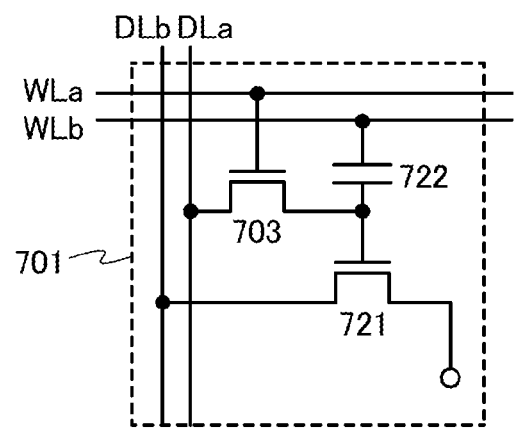
Figure 7C:
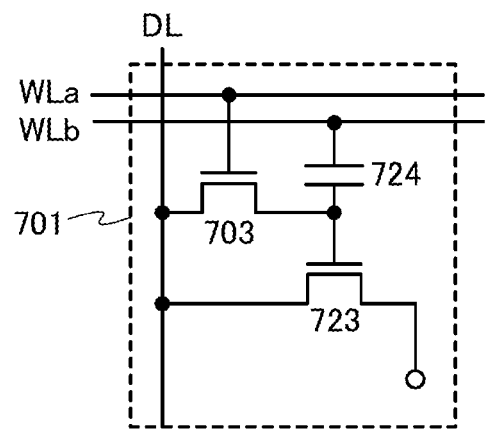

In this embodiment, structures of a storage device that is suited for an image memory are described. FIGS. 7A to 7C illustrate specific structure examples of a memory cell 701 included in a storage device.

Note that in this embodiment, the structure of the memory cell 701 is described referring to one of a source terminal and a drain terminal of a transistor as a first terminal and the other of the source terminal and the drain terminal of the transistor as a second terminal.

The memory cell 701 in FIG. 7A includes a transistor 703 functioning as a switching element and a capacitor 720. A gate electrode of the transistor 703 is connected to a word line WL. A first terminal of the transistor 703 is connected to a data line DL. A second terminal of the transistor 703 is connected to one electrode of the capacitor 720. The other electrode of the capacitor 720 is connected to a node to which a constant potential such as a ground potential is applied.

In the memory cell 701 in FIG. 7A, at the time of writing image data, the transistor 703 is turned on, so that the potential of a signal including image data is applied from the data line DL to one electrode of the capacitor 720 through the transistor 703. The amount of electric charge accumulated in the capacitor 720 is controlled in response to the potential of the signal, so that the image data is written to the memory cell 701.

Next, at the time of retaining the image data, the transistor 703 is turned off, so that the electric charge is held in the capacitor 720. Since the transistor 703 includes a wide-bandgap semiconductor such as an oxide semiconductor, the transistor 703 has extremely low off-state current. Thus, the electric charge accumulated in the capacitor 720 hardly leaks, and the image data can be retained for a longer period as compared to the case where a semiconductor such as silicon is used for the transistor 703.

At the time of reading the image data, the transistor 703 is turned on, so that the electric charge accumulated in the capacitor 720 is taken out through the data line DL. Then, by reading a difference in the amount of electric charge, the image data can be read.

The memory cell 701 in FIG. 7B includes the transistor 703 functioning as a switching element, a transistor 721, and a capacitor 722. The gate electrode of the transistor 703 is connected to a first word line WLa. The first terminal of the transistor 703 is connected to a first data line DLa. The second terminal of the transistor 703 is connected to a gate electrode of the transistor 721. A first terminal of the transistor 721 is connected to a second data line DLb. A second terminal of the transistor 721 is connected to a node to which a predetermined potential is applied. One of a pair of electrodes of the capacitor 722 is connected to the gate electrode of the transistor 721. The other of the pair of electrodes of the capacitor 722 is connected to a second word line WLb.

In the memory cell 701 in FIG. 7B, at the time of writing image data, the transistor 703 is turned on, so that the potential of a signal including image data is applied from the first data line DLa to the gate electrode of the transistor 721 through the transistor 703. The amount of electric charge accumulated in gate capacitance of the transistor 721 and the capacitor 722 is controlled in response to the potential of the signal, so that the image data is written to the memory cell 701.

Next, at the time of retaining the image data, the transistor 703 is turned off, so that the electric charge accumulated in the gate capacitance of the transistor 721 and the capacitor 722 is held. Since the transistor 703 includes a wide-bandgap semiconductor such as an oxide semiconductor as described above, the transistor 703 has extremely low off-state current. Thus, the accumulated electric charge hardly leaks, and the image data can be retained for a longer period as compared to the case where a semiconductor such as silicon is used for the transistor 703.

At the time of reading the image data, the potential of the second word line WLb is changed. A potential difference between the pair of electrodes of the capacitor 722 is held in accordance with the principle of conservation of charge; thus, a change in potential of the second word line WLb is given to the gate electrode of the transistor 721. The threshold voltage of the transistor 721 is changed in accordance with the amount of electric charge accumulated in the gate capacitance of the transistor 721. Thus, by reading a difference in the amount of accumulated electric charge from the amount of drain current of the transistor 721 which is obtained through the change in the potential of the gate electrode of the transistor 721, the image data can be read.

Note that a wide-bandgap semiconductor such as an oxide semiconductor may be used for an active layer of the transistor 721. Alternatively, for the active layer of the transistor 721, any of the following semiconductors may be used: amorphous silicon, microcrystalline silicon, polycrystalline silicon, single crystal silicon, amorphous germanium, microcrystalline germanium, polycrystalline germanium, and single crystal germanium. When oxide semiconductor films are used for active layers of all the transistors in the memory cell 701, a process can be simplified. Further, for example, when the active layer of the transistor 721 functioning as a memory element is formed using a semiconductor which provides higher mobility than an oxide semiconductor, such as polycrystalline silicon or single crystal silicon, image data can be read from the memory cell 701 at high speed.

The memory cell 701 in FIG. 7C differs from the memory cell 701 in FIG. 7B in that one data line DL has functions of the first data line DLa and the second data line DLb. Specifically, the memory cell 701 in FIG. 7C includes the transistor 703 functioning as a switching element, a transistor 723, and a capacitor 724. The gate electrode of the transistor 703 is connected to the first word line WLa. The first terminal of the transistor 703 is connected to the data line DL. The second terminal of the transistor 703 is connected to a gate electrode of the transistor 723. A first terminal of the transistor 723 is connected to the data line DL. A second terminal of the transistor 723 is connected to a node to which a predetermined potential is applied. One of a pair of electrodes of the capacitor 724 is connected to the gate electrode of the transistor 723. The other of the pair of electrodes of the capacitor 724 is connected to the second word line WLb.

The memory cell 701 in FIG. 7C can perform operation such as writing, retention, and reading of image data in a manner similar to that of the memory cell 701 in FIG. 7B.

A wide-bandgap semiconductor such as an oxide semiconductor may be used for an active layer of the transistor 723. Alternatively, for the active layer of the transistor 723, any of the following semiconductors may be used: amorphous silicon, microcrystalline silicon, polycrystalline silicon, single crystal silicon, amorphous germanium, microcrystalline germanium, polycrystalline germanium, and single crystal germanium. When oxide semiconductor films are used for active layers of all the transistors in the memory cell 701, a process can be simplified. Further, for example, when the active layer of the transistor 723 is formed using a semiconductor which provides higher mobility than an oxide semiconductor, such as polycrystalline silicon or single crystal silicon, image data can be read from the memory cell 701 at high speed.

The storage device including any of the memory cells 701 in FIGS. 7A to 7C has higher speed of writing and reading image data than a general nonvolatile storage device such as a flash memory; thus, the storage device is suited for an image memory that needs to operate at high speed.

Further, the storage device including any of the memory cells 701 in FIGS. 7A to 7C can retain image data for a long period. Thus, in the case where the storage device is used as an image memory, image data in the image memory is not easily lost even when supply of power supply voltage to a semiconductor display device is stopped. Thus, in the case where images to be displayed are the same before the stop of supply of power supply voltage and after the restart of supply of power supply voltage, it is not necessary to read image data again after the restart of supply of power supply voltage. Accordingly, power consumption can be reduced.

This embodiment can be combined with any of the other embodiments as appropriate.

REFERENCE NUMERALS

10: sequential logic unit, 31: transistor, 32: transistor, 33: transistor, 34: transistor, 35: transistor, 36: transistor, 37: transistor, 38: transistor, 39: transistor, 40: transistor, 41: transistor, 61: selection period, 62: non-selection period, 100: semiconductor display device, 101: CPU, 102: power supply controller, 103: panel controller, 104: image memory, 105: panel, 106: pixel portion, 107: driver circuit, 108: signal line driver circuit, 109: scan line driver circuit, 110: storage device, 120: consumed power, 121: consumed power, 122: consumed power, 130: pixel, 131: transistor, 132: liquid crystal element, 133: capacitor, 200: memory element, 201: memory circuit, 202: memory circuit, 203: switch, 204: switch, 205: switch, 206: logic element, 207: capacitor, 208: capacitor, 209: transistor, 210: transistor, 213: transistor, 214: transistor, 221: switching element, 222: memory element group, 250: memory element, 251: memory circuit, 252: memory circuit, 253a: logic element, 253b: logic element, 254: transistor, 255: transistor, 256: capacitor, 257: transistor, 258: p-channel transistor, 259: n-channel transistor, 260: p-channel transistor, 261: n-channel transistor, 500: substrate, 501: conductive film, 502: conductive film, 503: conductive film, 504: conductive film, 505: pixel electrode, 506: gate insulating film, 507: active layer, 508: insulating film, 509: insulating film, 510: spacer, 512: insulating film, 513: insulating film, 514: substrate, 515: common electrode, 516: liquid crystal layer, 517: light-blocking film, 600: CPU, 601: controller, 602: ALU, 603: data cache, 604: instruction cache, 605: program counter, 606: instruction register, 607: main storage device, 608: register file, 701: memory cell, 703: transistor, 720: capacitor, 721: transistor, 722: capacitor, 723: transistor, 724: capacitor, 5001: housing, 5002: housing, 5003: display portion, 5004: display portion, 5005: microphone, 5006: speaker, 5007: operation key, 5008: stylus, 5201: housing, 5202: display portion, 5203: support, 5401: housing, 5402: display portion, 5403: keyboard, 5404: pointing device, 5601: housing, 5602: housing, 5603: display portion, 5604: display portion, 5605: hinge, 5606: operation key, 5801: housing, 5802: housing, 5803: display portion, 5804: operation key, 5805: lens, and 5806: hinge.

This application is based on Japanese Patent Application serial No. 2011-261970 filed with Japan Patent Office on Nov. 30, 2011, the entire contents of which are hereby incorporated by reference.

The invention claimed is:

1. A semiconductor display device comprising:
   a pixel portion comprising a display element and a first transistor;
   a driver circuit; and
   a CPU comprising:
   a first memory circuit comprising a first volatile memory, and
   a second memory circuit comprising a first nonvolatile memory, the first nonvolatile memory comprising a second transistor and a first capacitor,
   wherein one of a source terminal and a drain terminal of the second transistor is electrically connected to an output terminal of the first memory circuit,
   wherein the other of the source terminal and the drain terminal of the second transistor is electrically connected to one electrode of the first capacitor,
   wherein the pixel portion is configured to display a still image after the driver circuit stops supplying an image signal to the pixel portion,
   wherein the second memory circuit is configured to store data stored in the first memory circuit before the CPU stops, and
   wherein each of the first transistor and the second transistor comprises a semiconductor whose bandgap is wider than bandgap of silicon in a channel formation region.

2. The semiconductor display device according to claim 1, wherein the semiconductor is an oxide semiconductor.

3. The semiconductor display device according to claim 2, wherein the oxide semiconductor comprises at least one of In, Ga, and Zn.

4. The semiconductor display device according to claim 1, further comprising:
   a third memory circuit comprising a second volatile memory, and
   a fourth memory circuit comprising a second nonvolatile memory, the second nonvolatile memory comprising a third transistor and a second capacitor,
   wherein one of a source terminal and a drain terminal of the third transistor is electrically connected to an output terminal of the third memory circuit,
   wherein the other of the source terminal and the drain terminal of the third transistor is electrically connected to one electrode of the second capacitor, and
   wherein the output terminal of the first memory circuit is electrically connected to an input terminal of the third memory circuit.

5. A semiconductor display device comprising:
a pixel portion comprising a display element and a first transistor;
a driver circuit; and
a CPU comprising:
   a first memory circuit comprising a first volatile memory, and
   a second memory circuit comprising a first nonvolatile memory, the first nonvolatile memory comprising a second transistor and a first capacitor,
wherein one of a source terminal and a drain terminal of the second transistor is electrically connected to an output terminal of the first memory circuit,
wherein the other of the source terminal and the drain terminal of the second transistor is electrically connected to one electrode of the first capacitor,
wherein the pixel portion is configured to display a still image after the driver circuit stops supplying an image signal to the pixel portion,
wherein the second memory circuit is configured to store data stored in the first memory circuit before the CPU stops,
wherein the second memory circuit is configured to retain the data while the CPU stops, respectively, and
wherein each of the first transistor and the second transistor comprises a semiconductor whose bandgap is wider than bandgap of silicon in a channel formation region.

6. The semiconductor display device according to claim 5, wherein the semiconductor is an oxide semiconductor.

7. The semiconductor display device according to claim 6, wherein the oxide semiconductor comprises at least one of In, Ga, and Zn.

8. The semiconductor display device according to claim 5, further comprising:
a third memory circuit comprising a second volatile memory, and
a fourth memory circuit comprising a second nonvolatile memory, the second nonvolatile memory comprising a third transistor and a second capacitor,
wherein one of a source terminal and a drain terminal of the third transistor is electrically connected to an output terminal of the third memory circuit,
wherein the other of the source terminal and the drain terminal of the third transistor is electrically connected to one electrode of the second capacitor, and
wherein the output terminal of the first memory circuit is electrically connected to an input terminal of the third memory circuit.

9. A semiconductor display device comprising:
a pixel portion comprising a display element and a first transistor;
a driver circuit; and
a CPU comprising:
   a first memory circuit comprising a first volatile memory, and
   a second memory circuit comprising a first nonvolatile memory, the first nonvolatile memory comprising a second transistor and a first capacitor,
wherein one of a source terminal and a drain terminal of the second transistor is electrically connected to an output terminal of the first memory circuit,
wherein the other of the source terminal and the drain terminal of the second transistor is electrically connected to one electrode of the first capacitor,
wherein the pixel portion is configured to display a still image after the driver circuit stops supplying an image signal to the pixel portion,
wherein the second memory circuit is configured to store data stored in the first memory circuit before the CPU stops, and to recover the data to the first memory circuit after the CPU restarts, and
wherein each of the first transistor and the second transistor comprises a semiconductor whose bandgap is wider than bandgap of silicon in a channel formation region.

10. The semiconductor display device according to claim 9, wherein the semiconductor is an oxide semiconductor.

11. The semiconductor display device according to claim 10, wherein the oxide semiconductor comprises at least one of In, Ga, and Zn.

12. The semiconductor display device according to claim 9, further comprising:
a third memory circuit comprising a second volatile memory, and
a fourth memory circuit comprising a second nonvolatile memory, the second nonvolatile memory comprising a third transistor and a second capacitor,
wherein one of a source terminal and a drain terminal of the third transistor is electrically connected to an output terminal of the third memory circuit,
wherein the other of the source terminal and the drain terminal of the third transistor is electrically connected to one electrode of the second capacitor, and
wherein the output terminal of the first memory circuit is electrically connected to an input terminal of the third memory circuit.

* * * * *